US009654154B2

United States Patent
Subrahmaniyan Radhakrishnan et al.

(10) Patent No.: US 9,654,154 B2
(45) Date of Patent: May 16, 2017

(54) RADIO FREQUENCY ADAPTIVE VOLTAGE SHAPING POWER AMPLIFIER SYSTEMS AND METHODS

(71) Applicant: Apple Inc., Cupertino, CA (US)

(72) Inventors: Gurusubrahmaniyan Subrahmaniyan Radhakrishnan, Milpitas, CA (US); Wassim El-Hassan, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/794,412

(22) Filed: Jul. 8, 2015

(65) Prior Publication Data

US 2016/0072457 A1 Mar. 10, 2016

Related U.S. Application Data

(63) Continuation-in-part of application No. 14/525,077, filed on Oct. 27, 2014.
(Continued)

(51) Int. Cl.
*H03F 1/32* (2006.01)
*H03G 3/30* (2006.01)
(Continued)

(52) U.S. Cl.
CPC ......... *H04B 1/0475* (2013.01); *H03F 1/0211* (2013.01); *H03F 1/0227* (2013.01);
(Continued)

(58) Field of Classification Search
CPC ........ H03F 1/0211; H03F 1/3247; H03F 1/32; H03F 1/3241; H03F 2201/3233;
(Continued)

(56) References Cited

U.S. PATENT DOCUMENTS 8,805,306 B2 * 8/2014 El-Hassan ............... H04B 17/13
455/115.1
8,824,981 B2 * 9/2014 Langer ..................... H03F 3/189
455/114.3
(Continued)

FOREIGN PATENT DOCUMENTS

EP 1986331 A1 1/2013
WO 2014033661 A1 3/2014

*Primary Examiner* — Michelle M Koeth
(74) *Attorney, Agent, or Firm* — Fletcher Yoder PC

(57) ABSTRACT

Systems and method for improving operation of a radio frequency system are provided. One embodiment includes instructions to execute a coarse calibration to associate a first output power with a first operational parameter set; instruct the radio frequency system to transmit a signal based at least in part on the first operational parameter set and a base detrough function; determine performance metrics resulting from transmission of the signal; determine changes in the performance metrics resulting from operating the radio frequency based at least in part on the first operational parameter set and each of a plurality of augmented detrough functions; and associate a second operational parameter set with a second output power, in which the second operational parameter set includes one of the plurality of augmented detrough functions selected based at least in part on the changes that reduce margin between the performance metrics and performance metric thresholds.

25 Claims, 13 Drawing Sheets

Related U.S. Application Data

(60) Provisional application No. 62/047,482, filed on Sep. 8, 2014.

(51) Int. Cl.
| | |
|---|---|
| *H04W 52/02* | (2009.01) |
| *H04B 1/04* | (2006.01) |
| *H03F 3/19* | (2006.01) |
| *H03G 1/00* | (2006.01) |
| *H03F 1/02* | (2006.01) |
| *H03G 3/00* | (2006.01) |
| *H03F 3/24* | (2006.01) |
| *H04B 17/13* | (2015.01) |

(52) U.S. Cl.
CPC .............. *H03F 1/3247* (2013.01); *H03F 3/19* (2013.01); *H03F 3/245* (2013.01); *H03G 1/0005* (2013.01); *H03G 3/004* (2013.01); *H04W 52/0225* (2013.01); *H04W 52/0251* (2013.01); *H03F 2200/102* (2013.01); *H03F 2200/321* (2013.01); *H03F 2200/451* (2013.01); *H03F 2201/3227* (2013.01); *H04B 17/13* (2015.01); *Y02B 60/50* (2013.01)

(58) Field of Classification Search
CPC .......... H03F 1/0227; H03F 3/245; H03F 3/19; H03G 3/004; H03G 1/00; H03G 1/0005; H04B 17/13; H04B 1/0475; Y02B 60/50; H04W 52/0251; H04W 52/0225
See application file for complete search history.

(56) References Cited

U.S. PATENT DOCUMENTS

| | | |
|---|---|---|
| 8,831,529 B2 | 9/2014 | Toh et al. |
| 8,909,175 B1 | 12/2014 | McCallister |
| 9,031,520 B2 | 5/2015 | McCallister |
| 9,042,848 B2 | 5/2015 | Collados Asensio et al. |
| 2012/0200354 A1 | 8/2012 | Ripley et al. |
| 2013/0257529 A1* | 10/2013 | Komninakis .......... H03F 1/0244 330/149 |
| 2014/0057684 A1* | 2/2014 | Khlat ................ H04W 52/0209 455/574 |
| 2015/0055732 A1 | 2/2015 | Pratt |

* cited by examiner

| $P_{OUT}$ (W) | RGI | PEAK PA $V_{cc}$ (W) | AMAM | AMPM | DETROUGH FUNCTION |
|---|---|---|---|---|---|
| 16.3 | $RGI_1$ | $PA\ V_{cc1}$ | $AMAM_1$ | $AMPM_1$ | $DF_1$ |
| 18.8 | $RGI_2$ | $PA\ V_{cc2}$ | $AMAM_2$ | $AMPM_2$ | $DF_2$ |
| 21.4 | $RGI_3$ | $PA\ V_{cc3}$ | $AMAM_3$ | $AMPM_3$ | $DF_3$ |
| 24.9 | $RGI_4$ | $PA\ V_{cc4}$ | $AMAM_4$ | $AMPM_4$ | $DF_4$ |
| ⋮ | | | | | |
*FIG. 12*
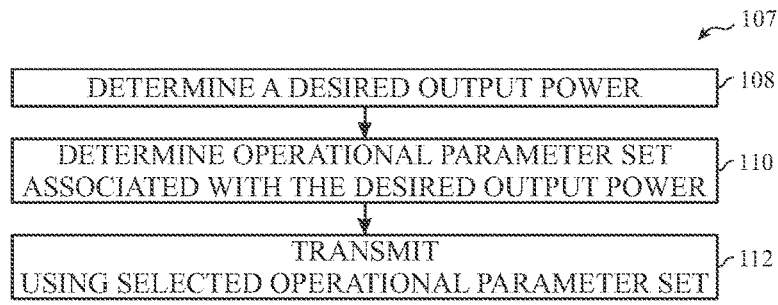
*FIG. 13*
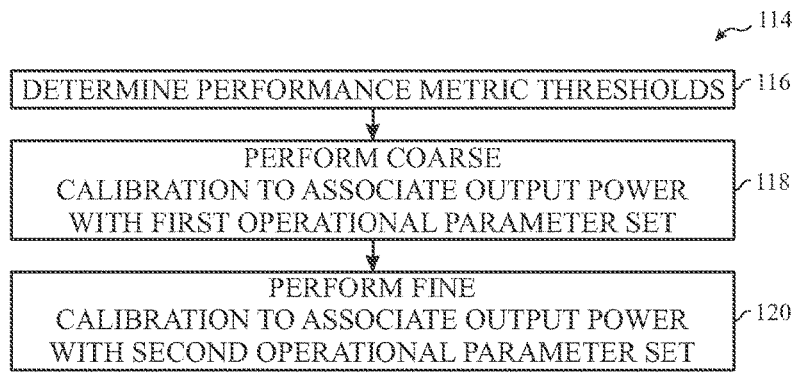
*FIG. 14*

| | INPUT VOLTAGE | PA SUPPLY VOLTAGE | $P_{OUT}$ (W) | RXBN | ACLR | COMP. VALUE |
|---|---|---|---|---|---|---|
| 136 | $V_{IN1}$ | $V_{MAX}$ | $P_{OUT1}$ | $RxBN_1$ | $ALCR_1$ | $CP_1$ |
| 138 | $V_{IN1}$ | $V_{INT}$ | $P_{OUT2}$ | $RxBN_2$ | $ALCR_2$ | $CP_2$ |
| | $V_{IN2}$ | $V_{MIN}$ | $P_{OUT3}$ | $RxBN_3$ | $ALCR_3$ | $CP_3$ |
| 140 | $V_{IN2}$ | $V_{MAX}$ | $P_{OUT2}$ | $RxBN_4$ | $ALCR_4$ | $CP_4$ |

| DETROUGH FUNCTION | ΔACKLR CH1 (DB) | ΔACKLR CH2 (DB) | ΔACKLR CH4 (DB) | ΔACKLR CH5 (DB) |
|---|---|---|---|---|
| $DF_1$ | 0 | 0 | 0 | 0 |
| $DF_2$ | -4 | -2 | -1 | -2 |
| $DF_3$ | -1 | -2 | -2 | -3 |
| $DF_4$ | -4 | -1 | -2 | -2 |
| ⋮ | | | | |

FIG. 19

| DETROUGH FUNCTION | ΔRxBN $F_{RX1}$(DB) | ΔRxBN $F_{RX2}$(DB) | ΔRxBN $F_{RX3}$(DB) | ΔRxBN $F_{RX4}$(DB) |
|---|---|---|---|---|
| $DF_1$ | 0 | 0 | 0 | 0 |
| $DF_2$ | -8.2 | -4.7 | -2.3 | -6.8 |
| $DF_3$ | -3.9 | -2.7 | -1.7 | -3.2 |
| $DF_4$ | -4.6 | -1.9 | -1.8 | -7.2 |
| ⋮ | | | | |

FIG. 20

RADIO FREQUENCY ADAPTIVE VOLTAGE SHAPING POWER AMPLIFIER SYSTEMS AND METHODS

CROSS-REFERENCE

This application claims the benefit of U.S. Provisional Patent Ser. No. 62/047,482, filed on Sep. 8, 2014, and U.S. patent application Ser. No. 14/525,077, filed on Oct. 27, 2014, which are both incorporated by reference in their entirety for all purposes.

BACKGROUND

The present disclosure relates generally to radio frequency systems and, more particularly, to controlling operation of a power amplifier used in a radio frequency system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices may include a radio frequency system to facilitate wireless communication of data with another electronic device and/or a network. The radio frequency system may include a transceiver that outputs an analog representation of data as an analog electrical signal, which may then be wirelessly transmitted via an antenna. Since the electronic devices may be separated by some distance, the radio frequency system may include a power amplifier to control the output power (e.g., strength of transmitted analog electrical signals) of the radio frequency system.

Generally, the power amplifier may utilize various techniques to amplify an input analog electrical signal to a desired output power. However, the techniques typically have tradeoffs between at least power consumption and introduced noise. For example, some techniques may reduce introduced noise but increase power consumption, thereby decreasing efficiency (e.g., output power/DC power consumption) of the radio frequency system. On the other hand, some techniques may reduce power consumption but increase introduced noise, which may increase transmitted spurious emissions (e.g., adjacent channel leakage and/or receive band noise).

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to improving operation of a radio frequency system based on controlling operation of a power amplifier in the radio frequency system. Generally, a power amplifier receives an analog electrical signal and outputs an amplified analog electrical signal, which may then be wirelessly transmitted to another electronic device and/or a network. As such, the output power (e.g., strength of the transmitted signal) of the radio frequency system may be based at least in part on the generation of the amplified analog electrical signal by the power amplifier. In some embodiments, the power amplifier may generate the amplified analog electrical signal based at least in part on the voltage of the analog electrical signal received from a transceiver and a power amplifier supply voltage ($PAV_{cc}$) received from an adjustable power supply circuitry.

Accordingly, in some embodiments, the radio frequency system may be operated based on calibration data that associates one or more desired output power each with an operational parameter set (e.g., radio frequency gain index (RGI), a peak power amplifier supply voltage ($PA\ V_{cc}$), and/or a detrough function). More specifically, the radio frequency gain index may indicate a peak voltage of the input analog electrical signal voltage, the peak power amplifier supply voltage may indicate the power amplifier supply voltage corresponding with the peak voltage, and the detrough function may describe the power amplifier supply voltage as a function of the input analog electrical signal voltage such that the peak voltage results in the peak power amplifier supply voltage.

In some embodiments, an operational parameter set associated with a desired output power may be determined to reduce power consumption by the radio frequency system, for example, by reducing the power amplifier supply voltage. Additionally, the operational parameter set associated with the desired output power may be determined such that operation of the radio frequency system meets performance metric thresholds (e.g., a receive band noise threshold and/or an adjacent channel leakage ratio threshold). However, reducing power consumption and resulting performance metrics may be inversely related.

Accordingly, a calibration process may be used to determine the calibration data such that operating at each operational parameter set achieves the desired output power, meets performance metric thresholds, and reduces power consumption. In some embodiments, the calibration process may include a coarse calibration and a fine calibration. More specifically, the coarse calibration may operate the power amplifier with multiple input analog electrical signal voltage and power amplifier supply voltage pairs. While operating at each pair, coarse calibration may determine resulting performance metrics (e.g., a receive band noise, adjacent channel leakage ratio, and/or compression value) and resulting output power.

The coarse calibration may then identify input analog electrical signal voltage and power amplifier supply voltage pairs that result in a desired output power and compare their corresponding performance metrics to performance metrics thresholds to select one of the pairs. Based on the selected pair, the coarse calibration may associate the desired output power with a first operational parameter set (e.g., radio frequency gain index (RGI) corresponding with selected input analog electrical signal voltage and a peak power amplifier supply voltage corresponding with selected power amplifier supply voltage).

The fine calibration may then operate the radio frequency system using the first operational parameter set with multiple detrough functions (e.g., a base detrough function and one or more augmented detrough functions). As used herein a "detrough function" is intended to describe the power amplifier supply voltage as a function of the input analog electrical signal voltage such that the peak voltage of the input analog electrical signal results in the peak power amplifier supply voltage. In other words, different detrough functions may describe different corresponding power amplifier supply voltages when the input analog electrical signal is modulated (e.g., reduced below the peak voltage).

As such, operating the radio frequency system using the first operational parameter set and each of the multiple detrough functions may result in varying performance metrics. Thus, the fine calibration may compare the performance metrics resulting from operating the radio frequency system with the first operational parameter set and each of the detrough functions to select one of the multiple detrough functions. For example, in some embodiments, the fine calibration may operate the radio frequency system using the peak voltage of the input analog electrical signal and the peak power amplifier supply voltage indicated by the first operational parameter set and a base (e.g., default) detrough function and determine resulting performance metrics. The fine calibration may then compare the resulting performance metrics with a table that describes changes in the performance metrics when operating at other detrough functions.

In this manner, the fine calibration may select a detrough function that facilitates meeting performance metric thresholds and/or that reduces margin from the performance metric thresholds, which may enable reducing power amplifier supply voltage and, thus, power consumption. Based on the selected detrough function, the fine calibration may associate the desired output power with a second operational parameter set (e.g., radio frequency gain index (RGI) from first operational parameter set, peak power amplifier supply voltage from the first operational parameter set, and the selected detrough function). Subsequently, the radio frequency system may operate using the calibration data to achieve a desired output power, meet performance metric thresholds, and/or reduces power consumption.

BRIEF DESCRIPTION OF THE DRAWINGS

Various aspects of this disclosure may be better understood upon reading the following detailed description and upon reference to the drawings in which:

FIG. 12 is a table describing calibration data used to operate the radio frequency system of FIG. 5, in accordance with an embodiment;

FIG. 13 is a flow diagram describing a process for using calibration data to operate the radio frequency system of FIG. 5, in accordance with an embodiment;

FIG. 14 is a flow diagram describing a calibration process for determining calibration data, in accordance with an embodiment;

FIG. 19 is a table describing effect different detrough functions have on adjacent channel leakage ratio (ACLR), in accordance with an embodiment;

FIG. 20 is a table describing effect the different detrough functions have on receive band noise (RxBN), in accordance with an embodiment.

DETAILED DESCRIPTION

Figure 1:
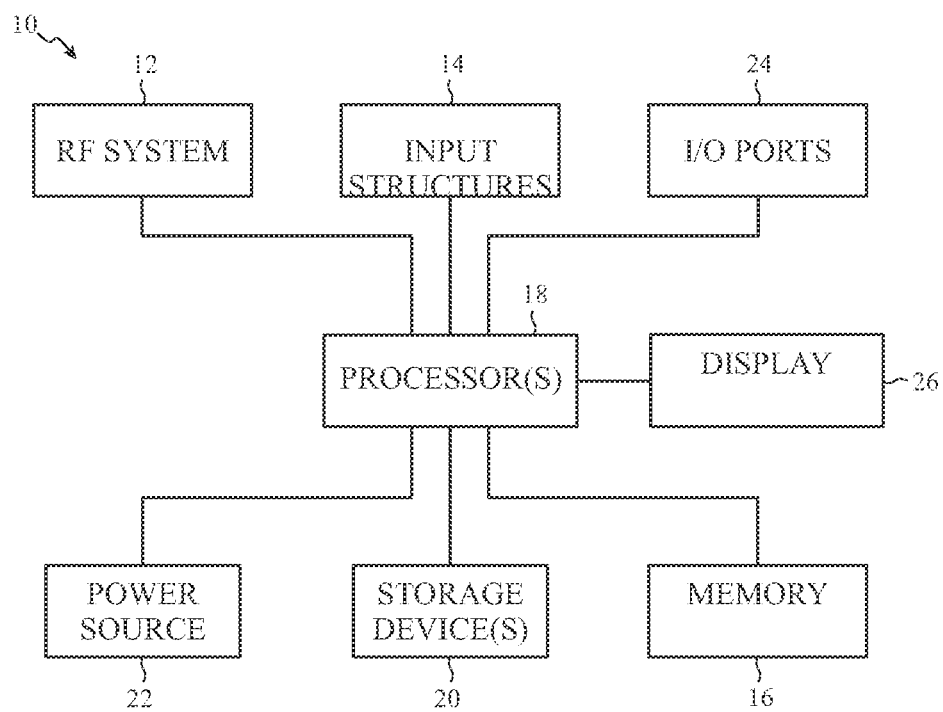
FIG. 1 is a block diagram of a electronic device with a radio frequency system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, an electronic device may include a radio frequency system to facilitate wirelessly communicating data with another electronic device and/or a network. More specifically, the radio frequency system may modulate radio waves to enable the electronic device to communicate via a personal area network (e.g., Bluetooth network), a local area network (e.g., an 802.11x Wi-Fi network), and/or a wide area network (e.g., a 4G or LTE cellular network). In other words, the radio frequency systems may utilize various wireless communication protocols to facilitate communication of data.

Nevertheless, radio frequency systems may generally be operationally similar regardless of the wireless communication protocol used. For example, to transmit data, processing circuitry (e.g., a digital signal generator) may generate a digital representation of the data as a digital electrical signal and a transceiver (e.g., a transmitter and/or a receiver) may then convert the digital electrical signal into an analog electrical signal. In some embodiments, the transceiver may represent the data by modulating the voltage of the analog electrical signal between a minimum voltage (e.g., zero) and a peak voltage.

Based on various factors (e.g., wireless communication protocol, power consumption, distance, etc.), the radio frequency system may wirelessly transmit signals at varying output power levels. To facilitate controlling the output power, a power amplifier may receive the analog electrical signal from the transceiver and output an amplified analog electrical signal to an antenna for transmission at a desired output power.

To facilitate amplifying the analog electrical signal, the power amplifier may also receive a power amplifier supply voltage from power supply circuitry. The power amplifier may generate the amplified analog electrical signal by selectively connecting its output to the power amplifier supply voltage based at least in part on the analog electrical signal voltage. In other words, the input analog electrical signal voltage and/or the power amplifier supply voltage may be adjusted to control the output power of signals transmitted from the radio frequency system.

To simplify discussion, each input analog electrical signal voltage and power amplifier voltage pair may be indicated by an operational parameter set. As used herein, an "operational parameter set" is intended to describe a set of operational parameters, which may include a radio frequency gain index (RGI), a peak power amplifier supply voltage (PA $V_{cc}$), an amplitude modulation (AMAM) pre-distortion coefficient, a phase modulation (AMPM) pre-distortion coefficient, a detrough function, or any combination thereof. For example, an operational parameter set may include a radio frequency gain index that indicates peak voltage of an input analog electrical signal voltage and a peak power amplifier supply voltage that indicates a power amplifier supply voltage corresponding with the peak voltage.

In fact, in some embodiments, multiple operational parameter sets may enable the power amplifier to generate approximately the same output power. Although capable of producing approximately the same output power, operating with different operational parameter sets may affect quality of the generated amplified analog electrical signal and/or radio frequency system power consumption. In some embodiments, the quality of an amplified analog electrical signal may be quantified using performance metrics, such as adjacent channel leakage or receive band noise. For example, increasing power amplifier supply voltage may reduce adjacent channel leakage and/or receive band noise, but increase power consumption. On the other hand, decreasing power amplifier supply voltage may increase adjacent channel leakage and/or receive band noise, but decrease power consumption.

As such, selecting an operational parameter set to implement may affect ability to use a radio frequency system in a specific jurisdiction. More specifically, in some jurisdictions, regulatory bodies, such as the Federal Communications Commission (FCC) in the United States, Industry Canada (IC) in Canada, the Ministry of Internal Affairs and Communications (MIC) in Japan, and the European Telecommunications Standards Institute (ETSI) in Europe, set regulations governing the quality of transmitted wireless signals. For example, such regulatory bodies may set an adjacent channel leakage ratio (ACLR) threshold (e.g., limit) that a radio frequency system transmitting in their jurisdiction must comply with. Accordingly, an operational parameter set may be selected to meet performance metric thresholds set by regulatory bodies.

Additionally, selecting an operational parameter set to implement may affect operation of the radio frequency system. For example, noise in a transmitted signal present at the receive band (e.g., frequency) may interfere with signals received by the radio frequency system. As such, receive band noise may affect ability of the radio frequency system to properly receive signals. Accordingly, an operational parameter set may be selected to meet performance metric thresholds that affect performance of the radio frequency system.

Furthermore, selecting an operational parameter set to implement may affect operation of the electronic device. More specifically, the power amplifier supply voltage indicated by an operational parameter set may affect power consumption by the radio frequency system and, thus battery life of the electronic device. For example, increasing the power amplifier supply voltage may cause the power consumption to increase, thereby decreasing battery life. On the other hand, decreasing the power amplifier supply voltage may cause the power consumption to decrease, thereby increasing battery life. As such, an operational parameter set may be selected to meet performance metric thresholds that affect performance of the electronic device. In other words, to produce a desired output power, the radio frequency system may operate with an operational parameter set that balances power consumption and quality of transmitted signals.

As will be described in more detail below, the present disclosure provides a calibration process for determining calibration data that associates an operational parameter set with a desired output power. The calibration process may select the operational parameter set to associate with the desired output power based at least in part on resulting output power, power consumption, and/or transmitted signal quality (e.g., performance metrics).

In some embodiments, the calibration process may include a coarse calibration process and a fine calibration process. More specifically, the coarse calibration process may associate a desired output power with a first operational parameter set based at least in part on operating the power amplifier with multiple input analog electrical signal voltage and power amplifier supply voltage pairs. For example, in some embodiments, the transceiver may gradually step up the input analog electrical signal voltage from a minimum value to a maximum value. Additionally, at each input analog electrical signal voltage, the power amplifier may gradually step down the power amplifier voltage from a maximum value to a minimum value.

While operating at each pair, the coarse calibration may determine resulting performance metrics (e.g., a receive band noise, adjacent channel leakage ratio, and/or compression value), resulting output power, other operational parameters (e.g., AMAM pre-distortion coefficient and AMPM pre-distortion coefficient), or any combination thereof. The coarse calibration may then identify input analog electrical signal voltage and power amplifier supply voltage pairs that result in a desired output power and compare their corresponding performance metrics to performance metrics thresholds to select one of the pairs.

Based on the selected pair, the coarse calibration may associate the desired output power with a first operational parameter set (e.g., radio frequency gain index (RGI) corresponding with selected input analog electrical signal voltage and a peak power amplifier supply voltage corresponding with selected power amplifier supply voltage). In this manner, the coarse calibration may associate the desired output power with a peak input analog electrical signal voltage and a corresponding peak power amplifier supply voltage.

However, as described above, the radio frequency system may transmit signals based at least in part on modulation. More specifically, to represent data in an analog manner, the transceiver may modulate (e.g., vary) the analog electrical signal voltage between a minimum (e.g., zero) voltage and a peak voltage. Additionally, to reduce power consumption, the power amplifier supply voltage may be varied based at least in part on the analog electrical signal voltage. For example, in an envelope tracking embodiment, the power amplifier supply voltage may be decreased when the analog electrical signal voltage is decreased. On the other hand, the power amplifier supply voltage may be increased when the analog electrical signal voltage is increased.

Thus, to transmit a signal, the radio frequency system may vary the input analog electrical signal and the power amplifier supply voltage from their respective peak voltages. However, as described above, performance metrics and/or power consumption may be affected by the input analog electrical signal voltage and/or the power amplifier supply voltage. In other words, in practice, the performance metrics resulting from implementing the first operational parameter set may vary from the performance metrics determined in the coarse calibration process.

Accordingly, the fine calibration process may associate the desired output power with a second operational parameter set that accounts for modulation. In some embodiments, the fine calibration process may operate the radio frequency system using the first operational parameter set with multiple detrough functions (e.g., a base detrough function and one or more augmented detrough functions). As described above, the first operational parameter set may include the radio frequency gain index (RGI), which may indicate a peak voltage, and a corresponding maximum power amplifier supply voltage (maxPAV$_{cc}$). Additionally, as used herein a "detrough function" is intended to describe the power amplifier supply voltage as a function of the input analog electrical signal voltage such that the peak voltage of the input analog electrical signal results in the peak power amplifier supply voltage.

As such, when the radio frequency system is operated using the first operational parameter set and a detrough function, the transceiver may vary the input analog electrical signal between a minimum voltage and the peak voltage in the first operational parameter set and the adjustable power supply circuitry may adjust the power amplifier supply voltage based on the detrough function accordingly. In this manner, the fine calibration process may operate the radio frequency system using the first operational parameter set with multiple detrough functions.

Additionally, since each of the multiple detrough functions may describe a different relationship between the power amplifier supply voltage and an input analog electrical signal, the power amplifier supply voltage profile described by each of the multiple detrough functions may vary when the input analog electrical signal voltage is less than the peak voltage. In other words, selection of a detrough function may affect the instantaneous power amplifier supply voltage and, thus, resulting performance metrics and/or power consumption of the radio frequency system. For example, a detrough function with a larger slope may decrease the instantaneous power amplifier supply voltage and, thus, increase receive band noise and/or adjacent channel leakage ratio. On the other hand, a detrough function with a smaller slope may increase the instantaneous power amplifier supply voltage and, thus, decrease receive band noise and/or adjacent channel leakage ratio.

As such, the fine calibration process may compare the performance metrics resulting from operating the radio frequency system with the first operational parameter set and each of the detrough functions to select one of the multiple detrough functions. For example, in some embodiments, the fine calibration may operate the radio frequency system using the peak voltage of the input analog electrical signal and the peak power amplifier supply voltage indicated by the first operational parameter set and a base (e.g., default) detrough function and determine resulting performance metrics. The fine calibration may then compare the resulting performance metrics with a table that describes changes in the performance metrics when operating at other detrough functions.

In this manner, the fine calibration may select a detrough function that facilitates meeting performance metric thresholds and/or that reduces margin from the performance metric thresholds, which may enable reducing power amplifier supply voltage and, thus, power consumption. Based on the selected detrough function, the fine calibration may associate the desired output power with a second operational parameter set (e.g., radio frequency gain index (RGI) from first operational parameter set, peak power amplifier supply voltage from the first operational parameter set, and the selected detrough function).

Subsequently, the radio frequency system may operate using the calibration data to achieve a desired output power, meet performance metric thresholds, and/or reduces power consumption. An operational parameter set may be retrieved from the calibration data based on a desired output power. The retrieved operational parameter set may then be implemented in the radio frequency system to transmit signals. For example, the transceiver may control voltage of a generated analog electrical signal based on a radio frequency gain index (RGI) in the retrieved operational parameter set to control voltage of a generated analog electrical signal. Additionally, the adjustable power supply circuitry may control power amplifier supply voltage based at least in part on a detrough function, the radio frequency gain index, and a peak power amplifier supply voltage in the retrieved operational parameter set.

To help illustrate, an electronic device 10 that may utilize a radio frequency system 12 is described in FIG. 1. As will be described in more detail below, the electronic device 10 may be any suitable electronic device, such as a handheld computing device, a tablet computing device, a notebook computer, and the like.

Accordingly, as depicted, the electronic device 10 includes the radio frequency system 12, input structures 14, memory 16, one or more processor(s) 18, one or more storage devices 20, a power source 22, input/output ports 24, and an electronic display 26. The various components described in FIG. 1 may include hardware elements (including circuitry), software elements (including computer code stored on a non-transitory computer-readable medium), or a combination of both hardware and software elements. It should be noted that FIG. 1 is merely one example of a particular implementation and is intended to illustrate the types of components that may be present in the electronic device 10. Additionally, it should be noted that the various depicted components may be combined into fewer components or separated into additional components. For example, the memory 16 and a storage device 20 may be included in a single component.

As depicted, the processor 18 is operably coupled with memory 16 and the storage device 20. More specifically, the processor 18 may execute instruction stored in memory 16 and/or the storage device 20 to perform operations in the electronic device 10, such as instructing the radio frequency system 12 to communicate with another device. As such, the processor 18 may include one or more general purpose microprocessors, one or more application specific processors (ASICs), one or more field programmable logic arrays (FPGAs), or any combination thereof. Additionally, memory 16 and/or the storage device 20 may be a tangible, non-transitory, computer-readable medium that stores instructions executable by and data to be processed by the processor 18. For example, the memory 16 may include random access memory (RAM) and the storage device 20 may include read only memory (ROM), rewritable flash memory, hard drives, optical discs, and the like.

Additionally, as depicted, the processor 18 is operably coupled to the power source 22, which provides power to the various components in the electronic device 10. For example, the power source 22 may supply direct current (DC) electrical power to the radio frequency system 12. As such, the power source 22 may include any suitable source of energy, such as a rechargeable lithium polymer (Li-poly) battery and/or an alternating current (AC) power converter. Furthermore, as depicted, the processor 18 is operably coupled with I/O ports 24, which may enable the electronic device 10 to interface with various other electronic devices, and input structures 14, which may enable a user to interact with the electronic device 10. Accordingly, the inputs structures 14 may include buttons, keyboards, mice, trackpads, and the like. Additionally, in some embodiments, the electronic display 26 may include touch sensitive components.

In addition to enabling user inputs, the electronic display 26 may display image frames, such as a graphical user interface (GUI) for an operating system, an application interface, a still image, or video content. As depicted, the display is operably coupled to the processor 18. Accordingly, the image frames displayed by the electronic display 26 may be based on display image data received from the processor 18.

As depicted, the processor 18 is also operably coupled with the radio frequency system 12, which may facilitate communicatively coupling the electronic device 10 to one or more other electronic devices and/or networks. For example, the radio frequency system 12 may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network. As can be appreciated, the radio frequency system 12 may enable communication using various communication protocols and/or varying output powers (e.g., strength of transmitted analog electrical signals).

Operational principles of the radio frequency system 12 may be similar for each of the communication protocols (e.g., Bluetooth, LTE, 802.11x Wi-Fi, etc). More specifically, as will be described in more detail below, the radio frequency system 12 may convert a digital electrical signal containing data desired to be transmitted into an analog electrical signal using a transceiver. The radio frequency system 12 may then amplify the analog electrical signal to a desired output using a power amplifier and output the amplified analog electrical signal using one or more antennae. In other words, the techniques described herein may be applicable to any suitable radio frequency system 12 that operates in any suitable manner regardless of communication protocol used.

Figure 2:
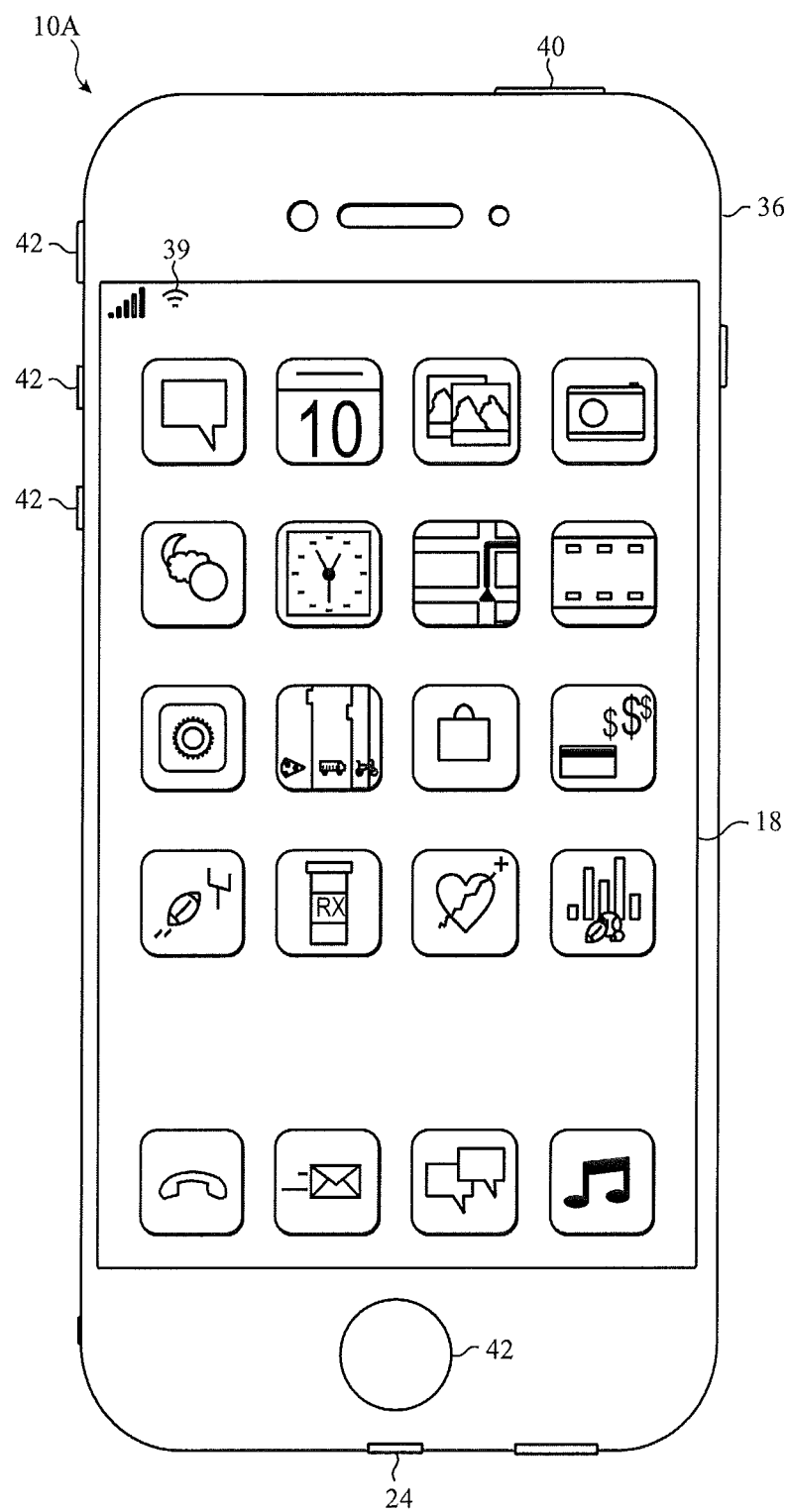
FIG. 2 is an example of the electronic device of FIG. 1, in accordance with an embodiment.

As described above, the electronic device 10 may be any suitable electronic device. To help illustrate, one example of a handheld device 10A is described in FIG. 2, which may be a portable phone, a media player, a personal data organizer, a handheld game platform, or any combination of such devices. For example, the handheld device 10A may be a smart phone, such as any iPhone® model available from Apple Inc. As depicted, the handheld device 10A includes an enclosure 28, which may protect interior components from physical damage and to shield them from electromagnetic interference. The enclosure 28 may surround the electronic display 26, which in the depicted embodiment, displays a graphical user interface (GUI) 30 having an array of icons 32. By way of example, when an icon 32 is selected either by an input structure 14 or a touch sensing component of the electronic display 26, an application program may launch.

Additionally, as depicted, input structures 14 may open through the enclosure (e.g., housing) 28. As described above, the input structures 14 may enable a user to interact with the handheld device 10A. For example, the input structures 14 may activate or deactivate the handheld device 10A, navigate a user interface to a home screen, navigate a user interface to a user-configurable application screen, activate a voice-recognition feature, provide volume control, and toggle between vibrate and ring modes. Furthermore, as depicted, the I/O ports 24 open through the enclosure 28. In some embodiments, the I/O ports 24 may include, for example, an audio jack to connect to external devices. Additionally, although not depicted, the radio frequency system 12 may also be enclosed within the enclosure 28 and internal to the handheld device 10A.

Figure 3:
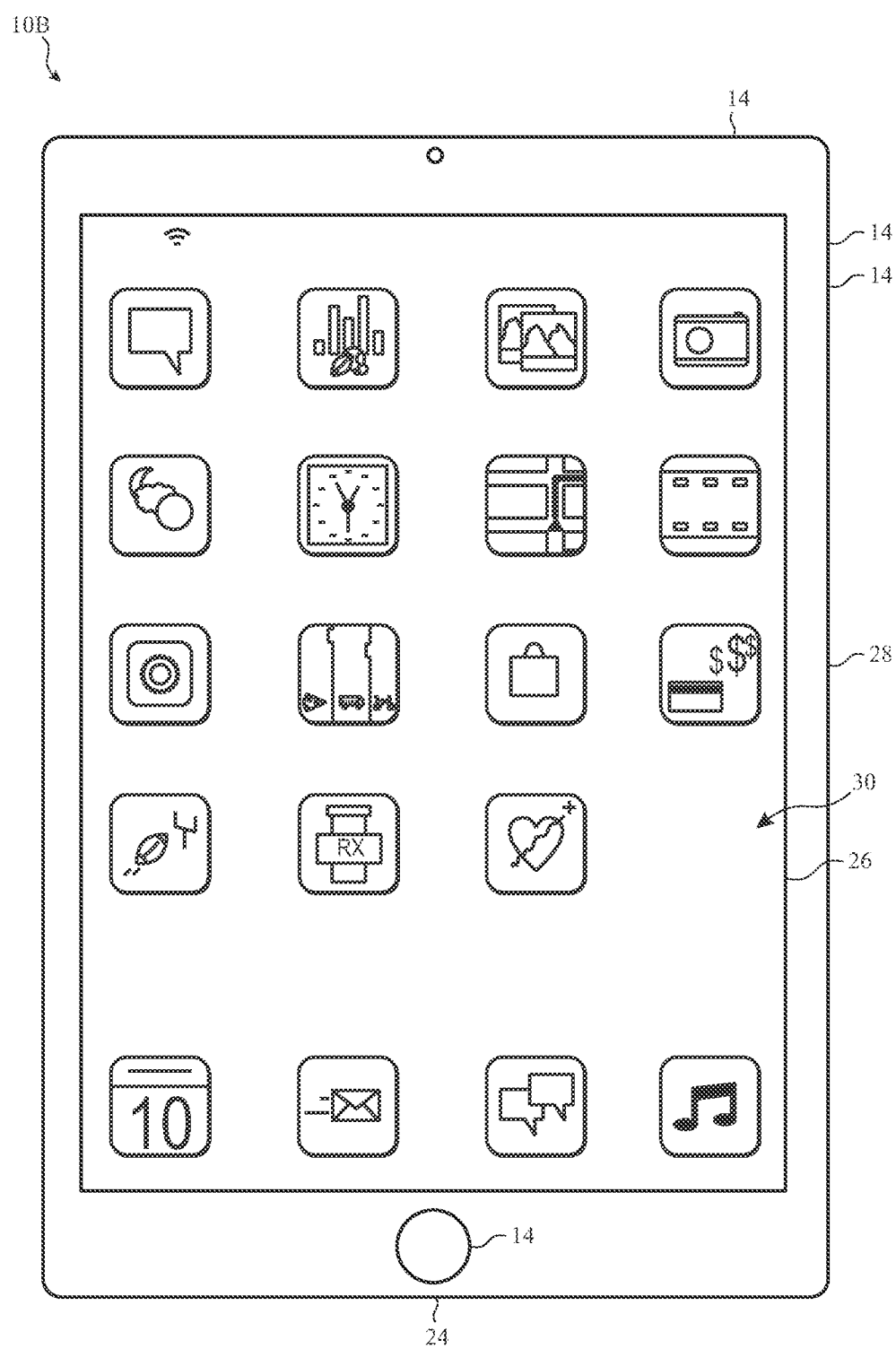
FIG. 3 is an example of the electronic device of FIG. 1, in accordance with an embodiment.
Figure 4:
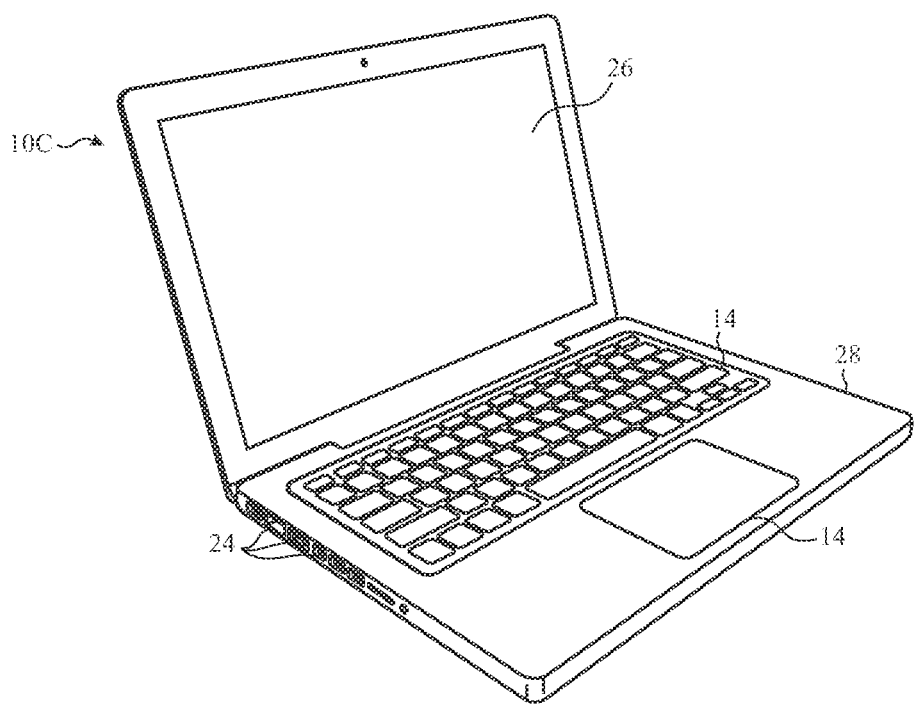
FIG. 4 is an example of the electronic device of FIG. 1, in accordance with an embodiment.

To further illustrate a suitable electronic device 10, a tablet device 10B is described in FIG. 3. For example, the tablet device 10B may be any tablet device, such as an iPad® model available from Apple Inc. Additionally, in other embodiments, the electronic device 10 may take the form of a computer 10C as described in FIG. 4. For example, the computer 10C may be any computer, such as any Macbook® or iMac® model available from Apple Inc. As depicted, the tablet device 10B and the computer 10C also include a display 26, input structures 14, I/O ports 24, and an enclosure (e.g., housing) 28. Similar to the handheld device 10A, although not depicted, the radio frequency system 12 may also be enclosed within the enclosure 28 and internal to the tablet device 10B and/or the computer 10C.

Figure 5:
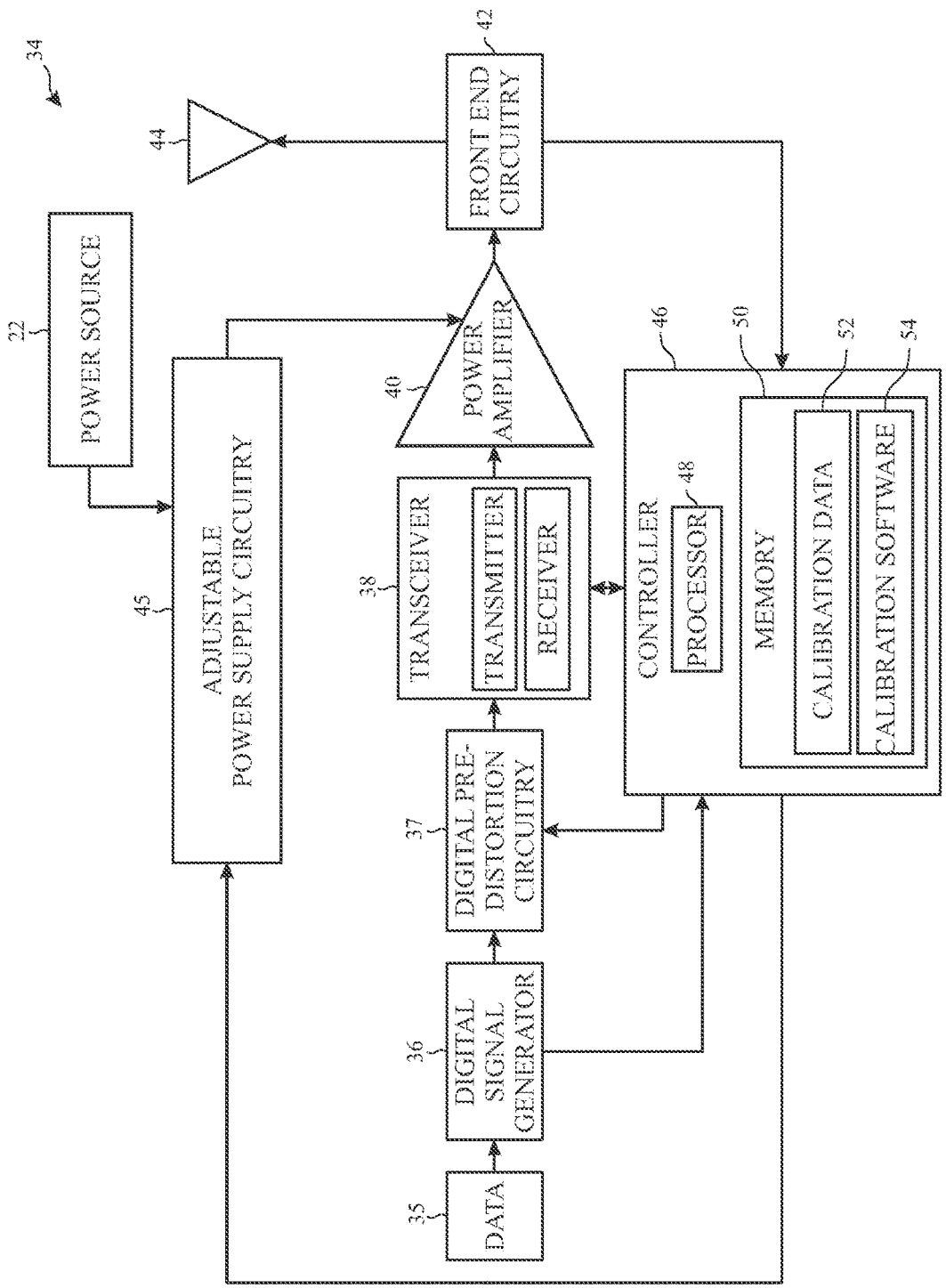
FIG. 5 is block diagram of a portion of the radio frequency system of FIG. 1, in accordance with an embodiment.

As described above, the radio frequency system 12 may facilitate communication between the electronic device 10 and other electronic devices and/or a network by wirelessly communicating data. To help illustrate, a portion 34 of radio frequency system 12 is described in FIG. 5. As depicted, the portion 34 includes a digital signal generator 36, digital pre-distortion circuitry 37, a transceiver 38, a power amplifier 40, front end circuitry 42, an antenna 44, adjustable power supply circuitry 45, and a controller 46.

As depicted, the controller 46 may include one or more controller processor 48 and one or more controller memory 50 to facilitate controlling operation of the radio frequency system 12. For example, the controller 46 may instruct the transceiver 38 to apply a specific radio frequency gain index (RGI) and/or instruct the adjustable power supply circuitry 45 to output a specific power amplifier supply voltage. Accordingly, in some embodiments, the controller processor 48 may be included in the processor 18 and/or separate processing circuitry and the memory 50 may be included in memory 16 and/or a separate tangible non-transitory computer-readable medium.

Additionally, the digital signal generator 36 may generate a digital representation of data 35 desired to be transmitted from the electronic device 10 by outputting a digital electrical signal. In some embodiments, the digital signal generator 36 may be included in the processor 18 and/or a separate processing circuitry, such as a baseband processor or a modem in the radio frequency system 12.

Furthermore, when included in the radio frequency system 12, the digital pre-distortion circuitry 37 may receive the digital electrical signal from the digital signal generator 36. The digital pre-distortion circuitry 37 may then apply digital pre-distortion to the digital electrical signal to mitigate (e.g., cancel) distortion introduced by the radio frequency system 12 (e.g., the transceiver 38 and/or the power amplifier 40). For example, the digital pre-distortion circuitry 37 may perform gain expansion on the digital electrical signal to compensate for compression in the power amplifier 40.

More specifically, the digital pre-distortion circuitry 37 may apply digital distortion based at least in part on an amplitude modulation (AMAM) pre-distortion coefficient and/or a phase modulation (AMPM) pre-distortion coefficient. In some embodiments, the pre-distortion coefficients may be determined by the controller 46 and communicated to the digital pre-distortion circuitry 37. In such embodiments, the controller 46 may receive a sample of the digital electrical signal from the digital signal generator 36 and a feedback sample of a transmitted from the front end circuitry 42. By comparing the samples, the controller 46 may determine noise (e.g., amplitude distortions and/or phase distortions) introduced by the radio frequency system 12 (e.g., transceiver 38 and/or power amplifier 40). The controller 46 may then determine the pre-distortion coefficients that would cancel the distortions introduced by the radio frequency system 12.

Subsequently, the transceiver 38 may receive the digital electrical signal and generate an analog representation of the data 35. For example, the transceiver 38 may generate an analog representation by outputting an amplitude signal to indicate a desired output power and an analog electrical signal to indicate phase (e.g., whether high or low) of the digital electrical signal.

As will be described in more detail below, the analog electrical signal may be generated based at least in part on calibration data 52. As described above, the calibration data 52 may associate a desired output power with an operational parameter set, which may include a radio frequency gain index (RGI), a peak power amplifier supply voltage, and/or a detrough function. More specifically, radio frequency gain index may indicate a peak voltage of the analog electrical signal, the peak power amplifier supply voltage may indicate a power amplifier supply voltage corresponding with the peak voltage, and the detrough function may describe the power amplifier supply voltage as a function of the input analog electrical signal voltage such that the peak voltage results in the peak amplifier supply voltage.

Accordingly, using the calibration data 52, the controller 46 may instruct the adjustable power supply circuitry 45 to output a corresponding power supply voltage to achieve the desired output power. In some embodiments, the adjustable power supply circuitry 45 may control the power amplifier supply voltage by stepping up or stepping down the electrical power received from the power source 22. Additionally, using the calibration data 52, the controller 46 may instruct the transceiver 38 to generate the analog electrical signal with a corresponding radio frequency gain index to achieve the desired output power.

Since the output power of the analog electrical signal may be small, the power amplifier 40 may receive and amplify the analog electrical signal by outputting an amplified analog electrical signal. More specifically the power amplifier 40 may selectively connect its output to the power amplifier supply voltage based at least in part on the magnitude of the analog electrical signal. As such, the output power of the amplified electrical signal may be based at least in part on the power amplifier supply voltage received from the adjustable power supply circuitry 45 and the analog electrical signal voltage received from the transceiver 38.

As described above, the radio frequency system 12 (e.g., transceiver 38 and/or power amplifier 40) may introduce noise into the amplified analog electrical signal, such as adjacent channel leakage, receive band noise, spurious emissions, and the like. As such, the front end circuitry 42 may include one or more filters 42 to remove introduced noise from the amplified analog electrical signal and output a filtered analog electrical signal. The filtered analog electrical signal may then be wirelessly transmitted to another electronic devices and/or a network via the antenna 44 as modulated radio waves.

Figure 6:
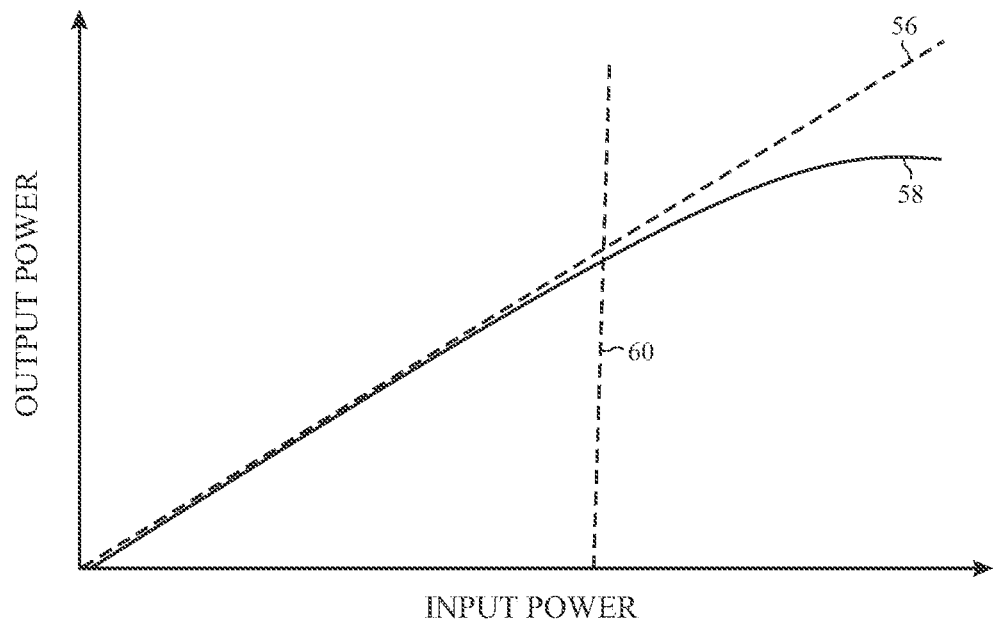
FIG. 6 is a plot describing input power versus output power for a power amplifier, in accordance with an embodiment.
Figure 7:
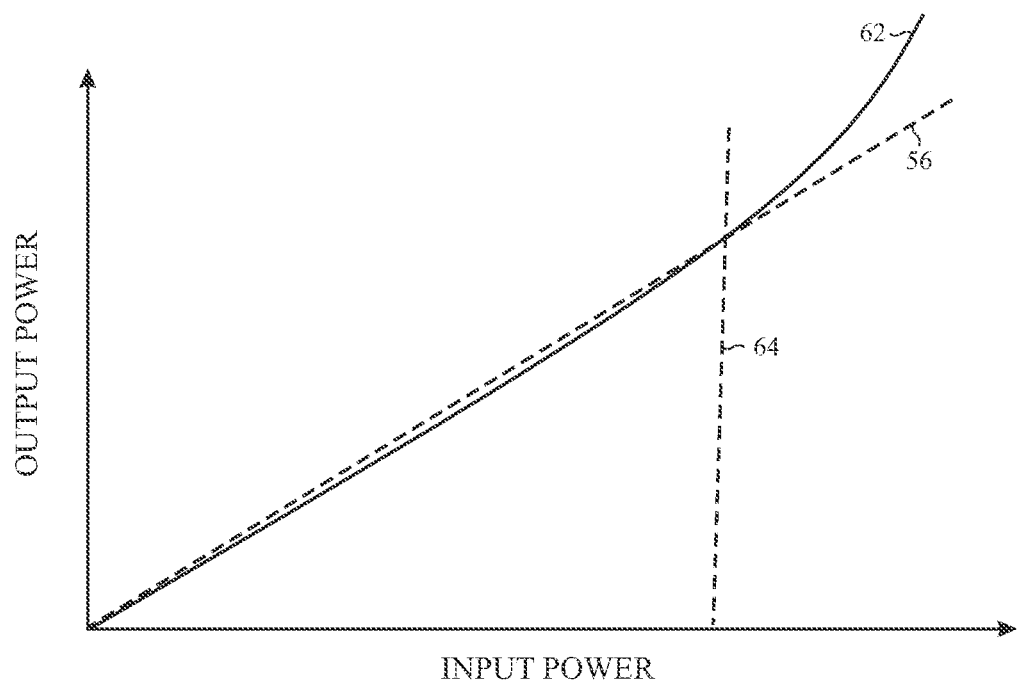
FIG. 7 is a plot describing input power versus output power for a power amplifier, in accordance with an embodiment.

As described above, the output power, resulting performance metrics, and/or power consumption may vary based on the analog electrical signal voltage and the power amplifier supply voltage. In some embodiments, the variations may be caused by nonlinearities in the power transfer characteristics of the power amplifier 40. To help illustrate, FIGS. 6 and 7 are plots describing the input power versus the output power of the power amplifier 40. Ideally, the power amplifier 40 may have a linear power transfer characteristic, which is described in FIGS. 6 and 7 by line 56. As depicted, line 56 has a constant slope across the input power range. In other words, each change in the input power results in a fixed amount of change in the output power.

However, in practice, power amplifiers 40 generally do not exhibit perfectly linear power transfer characteristics. In other words, changes in the input power may not always result in the fixed amount of change in the output power. For example, in FIG. 6, line 58 indicates a nonlinear power transfer characteristic of a power amplifier 40. As depicted, line 58 begins to deviate from the desired linear power transfer characteristics above a threshold input power 60. More specifically, the slope of line 58 above the threshold input power 60 indicates that the power amplifier 40 increases the output power at a slower rate in relation to increases of the input power. As such, the power amplifier 40 described by line 58 may be in gain compression when operating above the threshold input power 60.

Additionally, in FIG. 7, line 62 indicates another nonlinear power transfer characteristic of a power amplifier 40. As depicted, line 62 begins to deviate from the desired linear power transfer characteristics above a threshold input power 64. More specifically, the slope of line 60 above the threshold input power 64 indicates that the power amplifier 40 increases the output power at a faster rate in relation to increases of the input power. As described above, in some embodiments, the nonlinear power transfer characteristics may be accounted for in the digital pre-distortion circuitry 37, for example, by applying gain expansion when the power amplifier 40 is in gain compressions.

Figure 8:
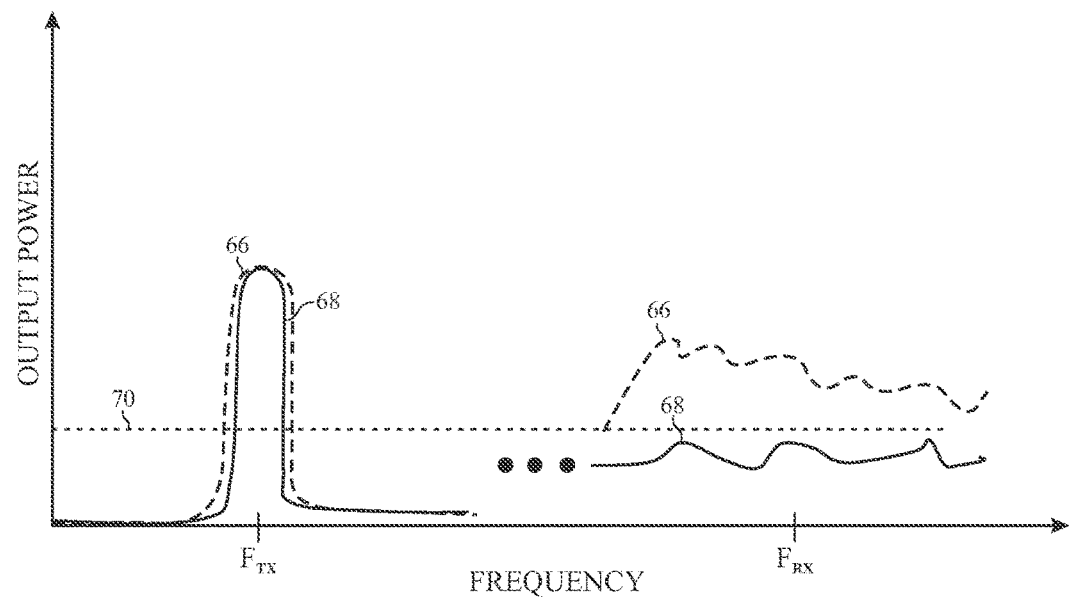
FIG. 8 is a plot describing output power of multiple transmitted signals versus frequency, in accordance with an embodiment.

In some embodiments, linearity of power amplifier 40 power transfer characteristics may be improved by increasing the power amplifier supply voltage and/or the input analog electrical signal voltage supplied to the power amplifier 40. To help illustrate, FIG. 8 describes a plot of output power versus frequency for a first transmitted signal 66, which has a lower power amplifier supply voltage, and a second transmitted signal 68, which has a higher power amplifier supply voltage. It should be noted that the first transmitted signal 66 and the second transmitted signal 68 are merely intended to be illustrative and not limiting. Additionally, FIG. 8 describes a receive band noise threshold 70, which may be a receive band noise (RxBN) above which affects the reception of receive signals by the antenna 44.

In the depicted embodiment, the radio frequency system 12 transmits signals at a transmission frequency ($F_{TX}$) and receives signals at a receive frequency ($F_{RX}$). Accordingly, as depicted, the first transmitted signal 66 and the second transmitted signal 68 are both transmitted at the transmission frequency with approximately the same magnitude.

However, as described above, linearity of the power amplifier 40 may decrease when the power amplifier supply voltage decreases, thereby increasing magnitude of introduced noise. For example, in the depicted embodiment, the first transmitted signal 66 and the second transmitted signal 68 both include some harmonic noise at the receive frequency. However, at the receive frequency, the higher power amplifier supply voltage enables the second transmitted signal 68 to remain below the receive band noise threshold 70. On the other hand, the lower power amplifier supply voltage causes the first transmitted signal 66 to surpass the receive band noise threshold 70. As such, the first transmitted signal 66 may potentially interfere with receive signal reception by the antenna 44. In other words, the lower power amplifier supply voltage of the first transmitted signal 66 may be inadequate to maintain sufficient linearity in the power amplifier 40 to satisfy the receive band noise threshold 70.

Figure 9:
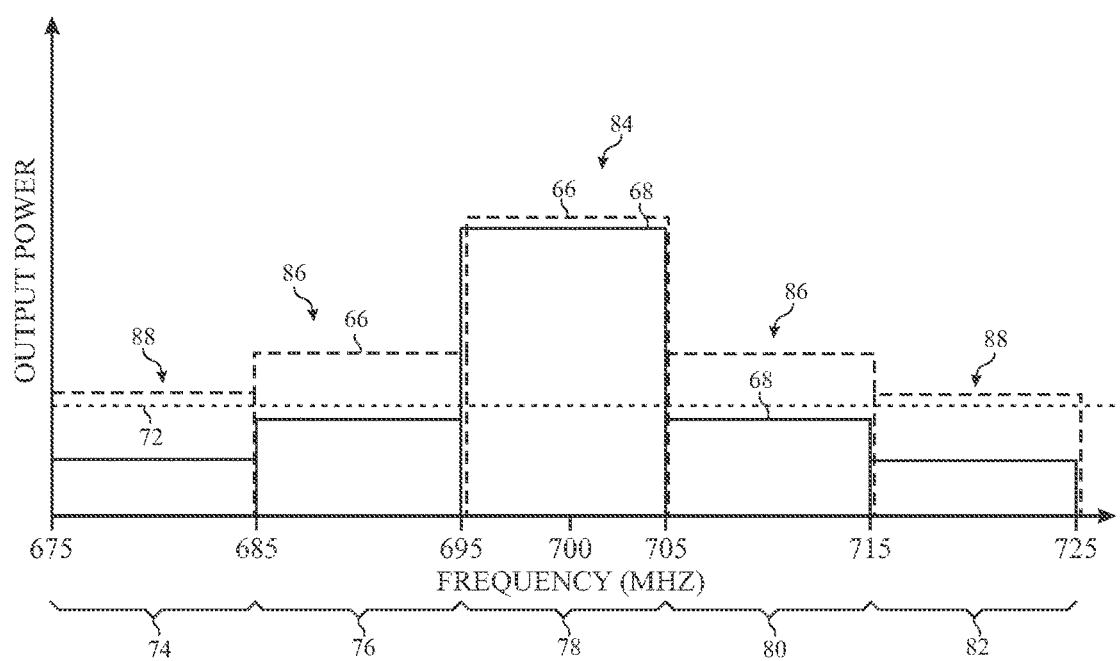
FIG. 9 is a plot describing output power of multiple transmitted signals versus frequency, in accordance with an embodiment.

As depicted, the first transmitted signal 66 also has a larger magnitude compared to the second transmitted signal 68 at frequencies adjacent the transmit frequency, which may be included in other channels. To more clearly illustrate, FIG. 9 describes the portion of the first transmitted signal 66 and the second transmitted signal 68 in a range (e.g., 675-725 MHz) around the transmission frequency (e.g., 700 MHz). Additionally, FIG. 9 describes an adjacent channel leakage ratio (ACLR) threshold 72, which describes an acceptable adjacent channel leakage ratio, for example, set by a regulatory body.

In the depicted embodiment, the radio frequencies are divided into channels with a bandwidth of 10 MHz. As such, FIG. 9 describes the magnitude of the first transmitted signal 66 and the second transmitted signal 68 in a first channel 74 between 675-685 MHz, a second channel 76 between 685-695 MHz, a third channel 78 between 695-705 MHz, a fourth channel 80 between 705-715 MHz, and a fifth channel 82 between 715-725 MHz. In the depicted embodiment, the first transmitted signal 66 and the second transmitted signal 68 each has a desired transmission bandwidth of 10 MHz. Thus, as depicted, the first transmitted signal 66 and the second transmitted signal 68 each includes a data portion 84 in the third channel 78. More specifically, the data portions 84 may include the analog representation of the data 35 desired to be wirelessly transmitted from the electronic device 10 to another electronic device and/or a network.

However, as depicted, the first transmitted signal 66 and the second transmitted signal 68 also include portions (e.g., noise) in adjacent channels. In some embodiments, the data portions 84 may also include noise or distortion introduced, for example, by the transceiver 38. As such, when the introduced noise or distortion is mixed in the power amplifier 40, intermodulation spurious emissions may result. Generally odd order intermodulation spurious emissions occur near the transmission frequency. More specifically, 3rd order intermodulation spurious emissions may occur in channels directly adjacent to the transmission channel, 5th order intermodulation spurious emissions may occur at channels two channels away from the transmission channel, 7th order intermodulation spurious emissions may occur at channels three channels away from the transmission channel, and so on.

For example, in the depicted embodiment, the first transmitted signal 66 and the second transmitted signal 68 both include 3rd order intermodulation spurious emissions 86 with a 10 MHz bandwidth that occur in the second channel 76 and the fourth channel 80. Additionally, the first transmitted signal 66 and the second transmitted signal 68 both include 5th order intermodulation spurious emissions 88 with a 10 MHz bandwidth that occur in the first channel 74 and the fifth channel 82.

However, as described above, linearity of the power amplifier 40 may decrease when the power amplifier supply voltage decreases, thereby increasing magnitude of introduced noise. For example, in the depicted embodiment, the higher power amplifier supply voltage enables the 3rd order intermodulation spurious emissions 86 and the fifth order intermodulation spurious emission 88 of the second transmitted signal 68 to remain below the adjacent channel leakage ratio threshold 72. On the other hand, the lower power amplifier supply voltage cause the 3rd order intermodulation spurious emissions 86 and the fifth order intermodulation spurious emission 88 of the first transmitted signal 66 to surpass the adjacent channel leakage ratio threshold 72. In other words, the lower power amplifier supply voltage of the first transmitted signal 66 may be inadequate to maintain sufficient linearity in the power amplifier 40 to satisfy the adjacent channel leakage ratio threshold 72.

As such, performance metrics (e.g., RxBN and ACLR) of a transmitted signal may be affected by the power amplifier supply voltage and/or the input analog electrical signal voltage. Thus, as will be described in more detail below, the calibration software 54 may perform a calibration process that determines the calibration data 52 such that a desired output power is associated with an operational parameter set, which when implemented produces the desired output power, provides sufficient linearity in the power amplifier 40 to maintain adjacent channel leakage below the adjacent channel leakage ratio threshold 72, and provide sufficient linearity in the power amplifier 40 to maintain receive band below the receive band noise threshold 70. In fact, in some embodiments, the calibration process may determine the calibration data 52 such that the margin between the transmitted signal and the adjacent channel leakage ratio threshold 72 and the margin between the transmitted signal the receive band noise threshold 70 are reduced, thereby enabling the power amplifier supply voltage to be decreased.

Figure 10:
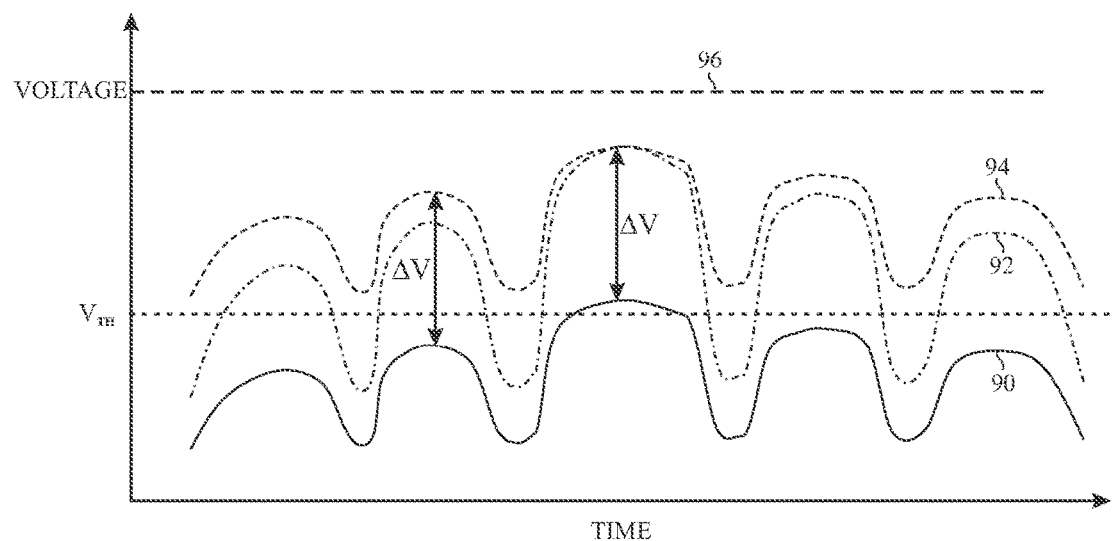
FIG. 10 is a plot of an input analog electrical signal voltage and multiple power amplifier supply voltages versus time, in accordance with an embodiment.

To help illustrate, FIG. 10 describes a plot of an input analog electrical signal voltage 90, a first power amplifier supply voltage 92, a second power amplifier supply voltage 94, and a third power amplifier supply voltage 96 versus time. More specifically, the input analog electrical signal voltage 90 describes the voltage profile of the analog electrical signal supplied to the power amplifier 40 from the transceiver 38. Additionally, the first power amplifier supply voltage 92, the second power amplifier supply voltage 94, and the third power amplifier supply voltage 96 each describes a voltage profile of power amplifier supply voltage supplied to the power amplifier 40 from the adjustable power supply circuitry 45.

As described above, the power amplifier 40 amplifies the input analog electrical signal by selectively connecting its output to the power amplifier supply voltage. Accordingly, to amplify the input analog electrical signal, the power amplifier supply voltage should be greater than the input analog electrical signal voltage 90. Additionally, as described above, the power amplifier supply voltage should be sufficiently greater than the input analog electrical signal voltage 90 to enable the radio frequency system 12 to meet performance metric thresholds.

For example, with regard to the depicted embodiment, the radio frequency system 12 may meet performance metric thresholds when the power amplifier supply voltage is greater than the input analog electrical signal voltage 90 by a voltage difference $\Delta V$. As depicted, the third power amplifier supply voltage 96 is greater than the input analog electrical signal voltage 90 by more than the voltage difference $\Delta V$ at each point in time. Additionally, as depicted, the second power amplifier supply voltage 94 is greater than the input analog electrical signal voltage 90 by the voltage difference $\Delta V$ at each point in time. Accordingly, the second power amplifier supply voltage 94 and the third power amplifier supply voltage 96 both enable the transmitted signal to meet performance metric thresholds.

Additionally, as depicted, the third power amplifier supply voltage 96 is greater than the second power amplifier supply voltage 94 at each point in time. As described above, increasing power amplifier supply voltage may improve resulting performance metrics and increase power consumption. As such, operating with the third power amplifier supply voltage 96 may improve the performance metrics of the transmitted signal compared to the second power amplifier supply voltage 94. However, since the second power amplifier supply voltage 94 is sufficient to enable meeting performance metric thresholds, the third power amplifier supply voltage 96 may merely increases margin with respect to the performance metric thresholds at the cost of increased power consumption. In other words, operating using the third power amplifier supply voltage 96 may cause unnecessary power consumption, which may decrease battery life of the electronic device 10.

In practice, the power amplifier 40 may only exhibit insufficient linearity at high input analog electrical signal voltages 90. For example, in the depicted embodiment, the power amplifier 40 may begin exhibiting insufficient linearity when the input analog electrical signal voltage 90 is greater than a threshold voltage $V_{TH}$. Thus, when the input analog electrical signal voltage 90 greater than the threshold voltage $V_{TH}$, the power amplifier supply voltage may be the voltage difference $\Delta V$ to enable a transmitted electrical signal to meet performance metric thresholds. However, when the input analog electrical signal voltage 90 is less than the threshold voltage $V_{TH}$, a power amplifier supply voltages less than the voltage difference $\Delta V$ greater than the input analog electrical signal voltage 90 may still be sufficient to meet performance metric thresholds.

In other words, it may be possible to further reduce the power amplifier supply voltage from the second power amplifier supply voltage 94 while still meeting performance metric thresholds. For example, the first power amplifier supply voltage 92 describes one such embodiment. As depicted, the first power amplifier supply voltage 92 is the voltage difference $\Delta V$ greater than the input analog electrical signal voltage 90 when the input analog electrical signal voltage 90 is greater than the threshold voltage $V_{TH}$. On the other hand, the first power amplifier supply voltage 92 is less than the voltage difference $\Delta V$ greater than the input analog electrical signal voltage 90 when the input analog electrical signal voltage 90 is less than the threshold voltage $V_{TH}$. As such, operating using the first power amplifier supply voltage 92 may enable meeting the performance metrics while decreasing power amplifier supply voltage at points in time when the input analog electrical signal voltage 90 is less than the threshold voltage $V_{TH}$, thereby reducing power consumption and/or improving battery life of the electronic device 10.

In fact, if not already, the first power amplifier supply voltage 92 may further be reduced to a minimum power amplifier voltage at each point in time sufficient to meet performance metric thresholds. More specifically, operating at such minimum power amplifier voltages may enable meeting performance metric thresholds while reducing power consumption. As described above, the power amplifier supply voltage generally changes as a function of the input analog electrical signal voltage. Accordingly, it may be desirable to operate using a detrough function that results in power amplifier supply voltages that are at or close to the minimum power amplifier voltages sufficient to meet performance metric thresholds.

Figure 11:
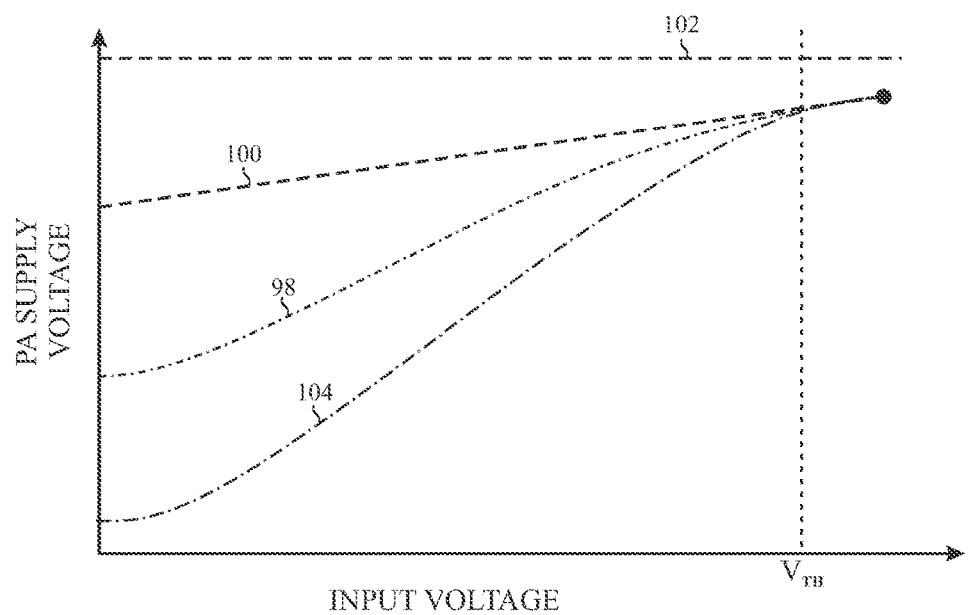
FIG. 11 is a plot of multiple detrough functions that describe power amplifier supply voltage as a function of input analog electrical signal voltage, in accordance with an embodiment.

To help illustrate, detrough functions corresponding with various power amplifier supply voltage profiles are described in FIG. 11. More specifically, FIG. 11 describes a first detrough function 98, a second detrough function 100, a third detrough function 102, and a fourth detrough function 104 on a plot of the power amplifier supply voltage versus the input analog electrical signal voltage.

As depicted, using the third detrough function 102, the power amplifier supply voltage is generally the same regardless of the input analog electrical signal voltage 90. Accordingly, the third detrough function 102 may take the following form:

$$PAV_{cc} = V \quad (1)$$

where $PAV_{cc}$ is the power amplifier supply voltage and V is a constant voltage. Thus, in some embodiments, the third detrough function 102 may be used to produce a voltage profile similar to the third power amplifier supply voltage 96.

Additionally, as depicted, using the second detrough function 100, the power amplifier supply voltage is generally greater than the input analog electrical signal voltage 90 by a fixed amount. Accordingly, the second detrough function 100 may take the following form:

$$PAV_{cc} = V_{in} + \Delta V \quad (2)$$

where $PAV_{cc}$ is the power amplifier supply voltage, $V_{in}$ is the input analog electrical signal voltage 90, and $\Delta V$ is a constant voltage. Thus, in some embodiments, the second detrough function 100 may be used to produce a voltage profile similar to the second power amplifier supply voltage 94.

Furthermore, as depicted, using the first detrough function 98, the power amplifier supply voltage changes by varying amounts depending on the input analog electrical signal voltage 90. In some embodiments, the first detrough function 98 may take the following form:

$$PAV_{cc}=A_1(V_{in})+Be^{-\alpha(V_{in})}-c \quad (3)$$

where $PAV_{cc}$ is the power amplifier supply voltage, $V_{in}$ is the input analog electrical signal voltage 90, $A_1$ is a first steepness coefficient, B is a constant, $\alpha$ is a constant, and c is a constant. As described above, the first power amplifier supply voltage 92 changes by varying amounts depending on the input analog electrical signal voltage 90. Thus, in some embodiments, the first detrough function 98 may be used to produce a voltage profile similar to the first power amplifier supply voltage 92.

As described above, it may be desirable to operate using a detrough function that results in power amplifier supply voltages that are at or close to a minimum power amplifier voltages sufficient to meet performance metric thresholds. Thus, as will be described in more detail below, the calibration software 54 may perform a calibration process to determine calibration data 52 by selecting a detrough function that meets performance metric thresholds while reducing power consumption.

To help illustrate, the resulting performance metrics and power consumption associated with using the various detrough functions is described. For the purpose of illustration, it is assumed that the voltage profile (e.g., second power amplifier supply voltage 94) described by the second detrough function 100 is sufficient to meet performance metric thresholds. As depicted, the power amplifier supply voltage resulting from the third detrough function 102 is higher than the power amplifier supply voltage resulting from the second detrough function 100 for each input analog electrical signal voltage 90. As such, a voltage profile (e.g., third power amplifier supply voltage 96) described by the third detrough function 102 is also sufficient to meet performance metric thresholds, but may cause increased power consumption compared to the second detrough function 100. Thus, the calibration process may select the second detrough function 100 over the third detrough function 102.

Additionally, as depicted, the power amplifier supply voltage resulting from the first detrough function 98 and the power amplifier supply voltage resulting from the second detrough function 100 is approximately the same at each input analog electrical signal voltage 90 greater than the threshold voltage $V_{TH}$. As such, when the input analog electrical signal voltage 90 is above the threshold voltage $V_{TH}$, the voltage profile (e.g., first power amplifier supply voltage 92) described by the first detrough function 98 is also sufficient to meet performance metric thresholds.

Furthermore, as depicted, the power amplifier supply voltage resulting from the first detrough function 98 is less than the power amplifier supply voltage resulting from the second detrough function 100 at each input analog electrical signal voltage 90 below the threshold voltage $V_{TH}$. As such, operating the radio frequency system 12 using the first detrough function 98 may reduce power consumption compared to the second detrough function 100. Thus, assuming that the voltage profile (e.g., first power amplifier supply voltage 92) described by the first detrough function 98 is also sufficient to meet performance metric thresholds at each input analog electrical signal voltage 90 below the threshold voltage $V_{TH}$, the calibration process may select the first detrough function 98 over the second detrough function 100 due to the reduced power consumption.

The calibration process may also select from other detrough functions, such as the fourth detrough function 104. In the depicted embodiment, operating the radio frequency system 12 using the fourth detrough function 104 may result in voltage profile that changes by varying amounts depending on the input analog electrical signal voltage 90. In other words, the fourth detrough function 104 may take a similar form to the first detrough function. For example, in some embodiments, the fourth detrough function 104 may take the following form:

$$PAV_{cc}=A_2(V_{in})+Be^{-\alpha(V_{in})}-c \quad (4)$$

where $PAV_{cc}$ is the power amplifier supply voltage, $V_{in}$ is the input analog electrical signal voltage 90, $A_2$ is a second steepness coefficient, B is a constant, $\alpha$ is a constant, and c is a constant. Thus, in such embodiments, the fourth detrough function 104 differs from the first detrough function 98 only in the steepness coefficient. More specifically, the steepness coefficient $A_2$ of the fourth detrough function 104 may be greater than the steepness coefficient $A_1$ of the first detrough function 98.

Nevertheless, as depicted, the power amplifier supply voltage resulting from the fourth detrough function 104 is approximately equal to the power amplifier supply voltage resulting from the first detrough function 98 at each input analog electrical signal voltage 90 above the threshold voltage $V_{TH}$. As such, when the input analog electrical signal voltage 90 is above the threshold voltage $V_{TH}$, the voltage described by the fourth detrough function 104 is also sufficient to meet performance metric thresholds.

However, as a result of the varying steepness coefficients, the power amplifier supply voltage resulting from the fourth detrough function 104 is less than the power amplifier supply voltage resulting from the first detrough function 98 at each input analog electrical signal voltage 90 below the threshold voltage $V_{TH}$. As such, operating the radio frequency system 12 using the fourth detrough function 104 may reduce power consumption compared to the first detrough function 98. Thus, assuming that the voltage profile described by the fourth detrough function 104 is also sufficient to meet performance metric thresholds at each input analog electrical signal voltage 90 below the threshold voltage $V_{TH}$, the calibration process may select the fourth detrough function 104 over the first detrough function 98 due to the reduced power consumption.

Thus, when the selecting between the four detrough functions, the calibration process may select the fourth detrough function 104 and associated with a desired output power in the calibration data 52. As described above, the calibration data 52 associates various desired output powers each with an operational parameter set. To help illustrate, one embodiment of calibration data 52 is described in FIG. 12.

In the depicted embodiment, the calibration data 52 is organized in a table format, which may be stored in the controller memory 50 or another tangible non-transitory computer-readable medium. More specifically, each desired output power may be associated with the operational parameters in the same row of the table. For example, in a first row 105, the calibration data 52 may associate a 16.3 W with a first radio frequency gain index $RGI_1$, a first peak power amplifier supply voltage $PA\ V_{cc1}$, a first amplitude modulation pre-distortion coefficient $AMAM_1$, a first phase modulation pre-distortion coefficient $AMPM_1$, and a first detrough function $DF_{1f}$. Additionally, in a second row 106, the calibration data 52 may associate an 18.8 W desired output power a second radio frequency gain index $RGI_2$, a second peak power amplifier supply voltage PA $V_{cc2}$, a second amplitude modulation pre-distortion coefficient $AMAM_2$, a second phase modulation pre-distortion coefficient $AMPM_2$, and a second detrough function $DF_2$. In a similar manner, the calibration data 52 may associate a 21.4 W desired output power and a 24.9 W desired output power with the operational parameters in their respective TOWS.

Thus, based at least in part on the calibration data 52, the radio frequency system 12 may determine operational parameter sets to implement based at least in part on a desired output power. To help illustrate, one embodiment of a process 107 for operation the radio frequency system 12 using the calibration data 52 is described in FIG. 13. Generally, the process 107 includes determining a desired output power (process block 108), determine an operational parameter set associated with the desired output power (process block 110), and transmitting using the operational parameter set (process block 112). In some embodiment, the process 107 may be implemented by instructions stored one or more tangible non-transitory computer-readable medium, such as controller memory 50, and executable by one or more processing circuitry, such as controller processor 48.

Accordingly, in such embodiments, the controller 46 may determine the desired output power (process block 108). More specifically, in some embodiments, the controller 46 may determine the desired output power based at least in part on an amplitude signal received from the transceiver 38. In other embodiments, the controller 46 may receive an indication of the desired output power from the processor 18 and/or the digital signal generator 36.

The controller 46 may then determine an operational parameter set associated with the desired output power (process block 110). As described above, calibration data 52 may store various desired output powers each with an operational parameter set. Accordingly, the controller 46 may retrieve the calibration data 52 and determine the operational parameter set based desired output power. More specifically, when the desired output power is listed in the calibration data 52, the controller 46 may determine that the operational parameter set includes the operation parameters (e.g., $RGI_1$, $maxPAV_{cc}$, AMAM, AMPM, and DF) in the same row as the desired output power.

However, in some embodiments, the calibration data 52 may include a finite number of output powers. For example, the calibration data 52 may include four desired output powers each and associated with an operational parameter set. In such embodiments, it is possible that the desired output power does not exactly match any of the listed output powers in the calibration data 52. In such instances, the controller 46 may determine the operational parameter set based on entries in the calibration data 52 closest to the desired output power. For example, in some embodiments, the controller may round the desired output power to the closest listed output power and select the corresponding operational parameter set. In other embodiments, the controller 46 may either always round up or always round down the desired output power to the closest listed output power and select the corresponding operational parameter set.

The controller 46 may then instruct the radio frequency system 12 to transmit using the determined operational parameter set (process block 112). In some embodiments, the determined operational parameter set includes a radio frequency gain index (RGI), a maximum power amplifier supply voltage ($maxPAV_{cc}$), an amplitude modulation (AMAM) pre-distortion coefficient, a phase modulation (AMPM) pre-distortion coefficient, and a detrough function. Accordingly, in such embodiments, the controller 46 may instruct the digital pre-distortion circuitry 37 to apply digital pre-distortion to the digital electrical signal received from the digital signal generator 36 based on the amplitude module pre-distortion coefficient and the phase modulation pre-distortion coefficient.

Additionally, the controller 46 may instruct the transceiver 38 to generate the analog electrical signal based on the digital electrical signal received from the digital pre-distortion circuitry 37 and the radio frequency gain index. More specifically, as described above, the radio frequency gain index may indicate the gain applied by the transceiver 38 when generating the analog electrical signal. In this manner, the controller 46 may control the input analog electrical signal voltage supplied to the power amplifier 40.

Furthermore, the controller 46 may instruct the adjustable power supply circuitry 45 to output the power amplifier supply voltage to the power amplifier based on the detrough function, the peak power amplifier supply voltage, the peak input analog electrical signal voltage, and the input analog electrical signal voltage. More specifically, as described above, the detrough function describes the power amplifier supply voltage as a function of the input analog electrical signal voltage such that the peak input analog electrical signal voltage results in the peak power amplifier supply voltage. In this manner, the controller 46 may determine the power amplifier supply voltage and instruct the adjustable power supply circuitry 45 accordingly.

As described above, the power amplifier 40 may then amplify the analog electrical signal received from the transceiver 38 using the power amplifier supply voltage received from the adjustable power supply circuitry 45 to generate an amplified analog electrical signal. The front end circuitry 42 may then filter the amplified analog electrical signal received from the power amplifier 40. Subsequently, the antenna 44 may transmit the amplified analog electrical signal (e.g., transmitted signal) by modulating radio frequency waves.

In this manner, the controller 46 may control the transmission by the radio frequency system 12 based at least in part on the calibration data 52. As described above, in some embodiments, the calibration software 54 may perform a calibration process used to determine the calibration data 52. More specifically, the calibration process may determine the calibration data 52 such that when an operational parameter set associated with a desired output power is implemented, the radio frequency system 12 produces the desired output power, meets performance metrics thresholds, and/or reduced power consumption.

To help illustrate, one embodiment of a process 114 for determining the calibration data 52 is described in FIG. 14. Generally, the process 114 includes determining performance metric thresholds (process block 116), performing a coarse calibration to associate an output power with a first operational parameter set (process block 118), performing a fine calibration to associate the output power with a second operational parameter set (process block 120). In some embodiment, the process 114 may be implement as instructions stored in one or more tangible non-transitory computer-readable medium, such as controller memory 50 (e.g., calibration software 54), and executable by one or more processing circuitry, such as controller processor 48.

Accordingly, any suitable processing circuitry may execute calibration software 54 to perform the calibration process 114. For example, in some embodiments, an external testing device may perform the calibration process 114 on the radio frequency system 12. To simplify the following discussion, the calibration process 114 will be described as being implemented by the controller 46. However, one of ordinary skill in the art would be able to adapt the techniques to other suitable processing circuitry.

Thus, the controller 46 may determine the performance metric thresholds (process block 116). More specifically, in some embodiments, the performance metric thresholds may be received from various sources and stored in the controller memory 50. For example, the performance metric thresholds may be received from a manufacturer, a wireless network (e.g., from a service provider), and/or a user and stored in the controller memory 50. Accordingly, in such embodiments, the controller 46 may determine the performance metric thresholds by retrieving the performance metric thresholds from the controller memory 50.

As described above, the performance metric thresholds may describe operating constraints that the radio frequency system 12 is instructed to operated under. For example, a regulatory body may set an adjacent channel leakage ratio (ACLR) threshold to limit amount of adjacent channel leakage the radio frequency system 12 is permitted to transmit. Additionally, a manufacturer may set a receive band noise (RxBN) threshold to limit amount of receive band noise the radio frequency system 12 is allowed to transmit without interfering with reception of received signals.

Accordingly, based at least in part on the performance metric thresholds, the controller 46 may perform a coarse calibration to associate an output power with a first operational parameter set (process block 118). As will be described in more detail below, in some embodiments, the coarse calibration may determine the first operational parameter set such that the radio frequency system 12 meets the performance metric thresholds. Subsequently, the controller 46 may perform a fine calibration to associate the output power with a second operational parameter set (process block 120). As will be described in more detail below, in some embodiments, the fine calibration may based at least in part on the first operational parameter set to reduce margin between performance metric thresholds and, thus, enable reduced power consumption.

Figure 15:
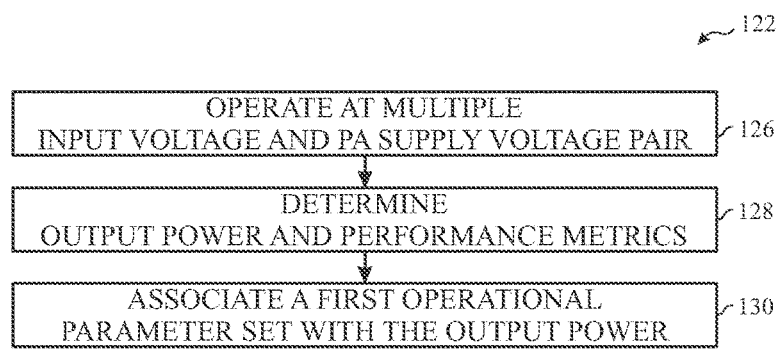
FIG. 15 is a flow diagram describing a coarse calibration process in the calibration process of FIG. 14, in accordance with an embodiment.

To help illustrate, one embodiment of a process 122 for performing the coarse calibration is described in FIG. 15. Generally, the process 122 includes operating at multiple input voltage and power amplifier supply voltage pairs (process block 126), determining resulting output power and performance metrics (process block 128), and associating an operational parameter with an output power (process block 130). In some embodiments, the process 122 may be implemented by instructions stored in one or more tangible non-transitory computer-readable medium, such as controller memory 50, and executable by one or more processing circuitry, such as controller processor 48.

Accordingly, in such embodiments, the controller 46 may instruct the radio frequency system 12 to operate at multiple input analog electrical signal voltage and power amplifier supply voltage pairs (process block 126). In some embodiments, the controller 46 may instruct the transceiver 38 to vary the input analog electrical signal voltage in a stepwise manner. For example, the transceiver 38 may increase the input analog electrical signal voltage from a minimum input voltage to a maximum input voltage in a stepwise manner (e.g., via voltage steps). Additionally, the controller 46 may instruct the adjustable power supply circuitry 45 to vary power amplifier supply voltage in a stepwise manner at each input analog electrical signal voltage. For example, the adjustable power supply circuitry 45 may decrease power amplifier supply voltage from a maximum power amplifier supply voltage to a minimum power amplifier supply voltage in a stepwise manner (e.g., via voltage steps) while the input analog electrical signal voltage is at each voltage step.

Figure 16:
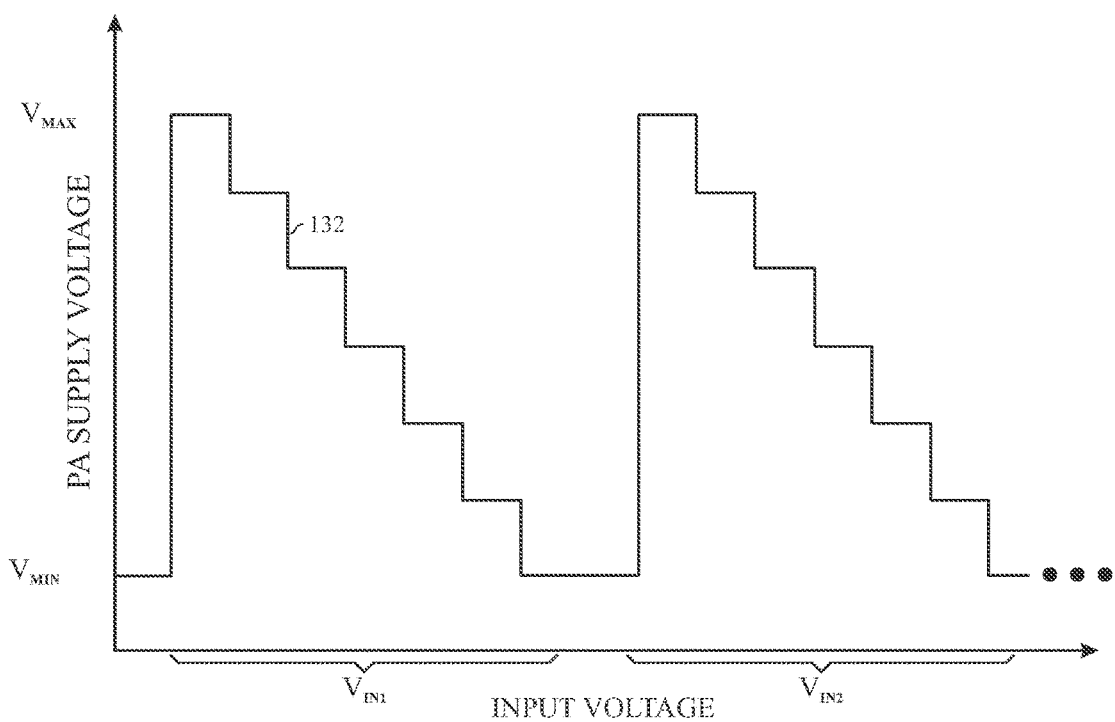
FIG. 16 is a plot describing power amplifier supply voltage versus input analog electrical voltage during the coarse calibration process of FIG. 15, in accordance with an embodiment.

To help illustrate such an embodiment, FIG. 16 depicts a plot of the power amplifier supply voltage 132 versus input analog electrical signal voltage. Based on the depicted embodiment, the controller 46 may instruct the transceiver 38 to output the input analog electrical signal voltage at a first input voltage $V_{in1}$. Additionally, while at the first input voltage $V_{in1}$, the controller 46 may also instruct the adjustable power supply circuitry 45 to output gradually step down the power amplifier supply voltage from a maximum voltage $V_{max}$ to a minimum voltage $V_{min}$. In some embodiments, the maximum voltage $V_{max}$ may be the voltage output by the power source 22 and the minimum voltage $V_{min}$ may be the lowest voltage sufficient to operate the power amplifier 40. For example, in the depicted embodiment, the controller 46 instructs the adjustable power supply circuitry to output the maximum voltage $V_{max}$, five intermediate voltages, and the minimum voltage $V_{min}$ while the transceiver 38 outputs the first peak input voltage $V_{in1}$.

After reaching the minimum voltage $V_{min}$, the controller 46 may instruct the transceiver 38 to adjust the input analog electrical signal voltage to a second input voltage $V_{in2}$. Additionally, while at the second input voltage $V_{in2}$, the controller 46 may again instruct the adjustable power supply circuitry 45 to gradually step down from the maximum voltage $V_{max}$ to the minimum voltage $V_{min}$. In a similar manner, controller 46 may instruct the transceiver 38 and the adjustable power supply circuitry 45 to operate the radio frequency system 12 with other input analog electrical signal voltage and power amplifier supply voltage pairs.

Returning to the process 122 of FIG. 15, while operating at each input analog electrical signal voltage and power amplifier supply voltage pair, the controller 46 may determine resulting output power and performance metrics (process block 128). In some embodiments, the controller 46 may determine the resulting output power and performance metrics based at least in part on a feedback of transmitted signals. Generally, the controller 46 may determine the resulting output power based at least in part on magnitude of a transmitted signal. For example, the controller 46 may perform a Fourier transform on the transmitted signal to determine magnitude of a transmitted signal various frequencies, such as the receive band. In this manner, the controller 46 may determine receive band noise (RxBN) based on magnitude of the transmitted signal at the receive band and the adjacent channel leakage ratio (ACLR) based on magnitude of the transmitted signal at adjacent channels.

Furthermore, in some embodiments, the controller 46 may determine compression value of the power amplifier 40 based at least in part on a feedback of the transmitted signal. More specifically, as described above, the controller 46 may determine digital pre-distortion coefficients to use in the digital pre-distortion circuitry 37 to compensate for the compression of the power amplifier 40. In other words, the controller 46 may also determine other operational parameters, such as an amplitude modulation AMAM pre-distortion coefficient and/or a phase modulation AMPM pre-distortion coefficient, associated with operating the radio frequency system 12 at each input analog electrical signal voltage and power amplifier supply voltage pair.

Figures 17, 18:
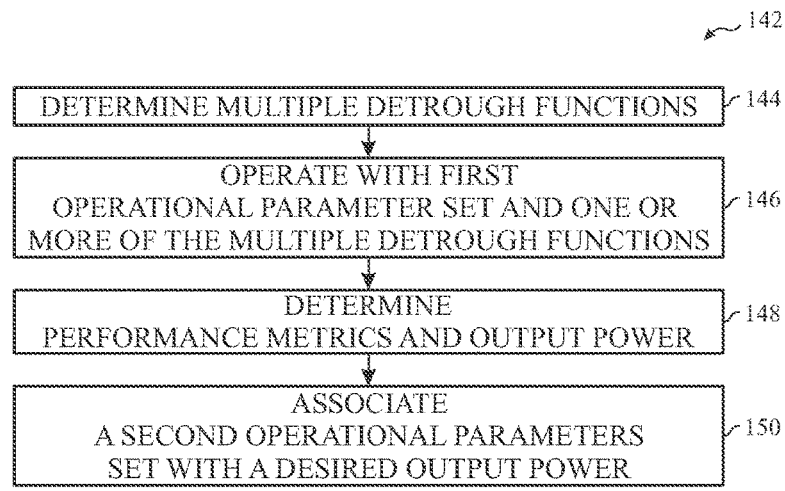
FIG. 17 is a table describing results of the coarse calibration process of FIG. 15, in accordance with an embodiment.
FIG. 18 is a flow diagram describing a fine calibration process in the calibration process of FIG. 14, in accordance with an embodiment.

The resulting output power and performance metrics may be stored (e.g., in the controller memory 50) to facilitate the controller 46 to associate an operational parameter set (e.g., the first operational parameter set) with a desired output power (process block 130). To help illustrate, FIG. 17 depicts a table 134 relating each input analog electrical signal voltage and power amplifier supply voltage pair with a resulting output power and resulting performance metrics. In some embodiments, the table 134 may be stored in the controller memory 50 or another tangible non-transitory computer-readable medium.

In the depicted embodiment, each input analog electrical signal voltage and power amplifier supply voltage pair may be associated with output power and performance metrics in the same row of the table. For example, in a first row 136, the table 134 indicates that operating at the first input voltage $V_{in1}$ and the maximum power amplifier supply voltage $V_{max}$ resulted in a first power output $P_{out1}$, a first receive band noise $RxBN_1$, a first adjacent channel leakage ratio $ACLR_1$, and a first compression value $CP_1$. Additionally, in a second row 138, the table 134 indicates that operating at the first input voltage $V_{in1}$ and an intermediate power amplifier supply voltage $V_{int}$ resulted in a second power output $P_{out2}$, a second receive band noise $RxBN_2$, a second adjacent channel leakage ratio $ACLR_2$, and a second compression value $CP_2$.

As described above, multiple input analog electrical signal voltage and power amplifier supply voltage pairs may result in approximately the same output power with varying performance metrics and/or power consumption. For example, in a fourth row 140, the table 134 indicates that operating at a second input voltage $V_{in2}$ and the maximum power amplifier supply voltage $V_{max}$ resulted in the second power output $P_{out2}$, a third receive band noise $RxBN_3$, a third adjacent channel leakage ratio $ACLR_3$, and a third compression value $CP_3$. In other words, operating the radio frequency system 12 with a first pair (e.g., first input voltage $V_{in1}$ and intermediate power amplifier supply voltage $V_{int}$) and with a second pair (e.g., second input voltage $V_{in2}$ and the maximum power amplifier supply voltage $V_{max}$) both resulted in approximately the same output power (e.g., second power output $P_{out2}$).

Accordingly, the controller 46 may differentiate between the pairs resulting in the same output power based at least in part on their respective resulting performance metrics. More specifically, as described above, the controller 46 may compare the resulting performance metrics to one or more performance metric thresholds. In some embodiments, when only one pair (e.g., input voltage and power amplifier supply voltage) enables generating a desired output power and meeting the performance metric thresholds, the controller 46 may associate that pair with the desired output power. Additionally, when multiple pairs enable generating the desired output power and meeting the performance metric thresholds, the controller 46 associate one of the multiple pairs with the desired output power, for example, based on power consumption and/or random selection.

In some embodiments, it is possible that no pairs enable generating the desired output power and meeting all of the performance metric thresholds. In such instances, the controller 46 may nevertheless associate the desired output with one of the input voltage and power amplifier supply voltage pairs. For example, in some embodiments, the controller 46 may associate the desired power with a pair that meets the most number of performance metric thresholds. In other embodiments, the controller 46 may associate the desired output power with a pair that is closest to satisfying all of the performance metric thresholds.

The controller may then determine operational parameter sets corresponding with the input voltage and power amplifier supply voltage pairs. As described above, in some embodiments, an operational parameter set may include a radio frequency gain index (RGI) and a peak power amplifier supply voltage. In such embodiments, the controller 46 may determine a corresponding radio frequency gain index based on the input voltage. More specifically, the controller 46 may set the input voltage as a peak voltage of the input analog electrical signal and set the radio frequency gain index to the gain used to produce the input voltage in the associated pair. Additionally, the controller 46 may set the peak power amplifier supply voltage to the power amplifier supply voltage in the associated pair.

Once the operational parameter sets are determined, the controller 46 may then associate the operational parameter sets with the corresponding output powers. In this manner, the controller associates an output power with a first operational parameter set.

As described above, the fine calibration may then associate the output power with a second operational parameter set. To help illustrate, one embodiment of a process 142 for performing the fine calibration is described in FIG. 18. Generally, the process 142 includes determining multiple detrough functions (process block 144), operating with a first operational parameter set and one or more of the multiple detrough functions (process block 146), determining resulting performance metrics and output power (process block 148), and associating a second operational parameter set with a desired output power (process block 150). In some embodiments, the process 142 may be implemented by instructions stored in one or more tangible non-transitory computer-readable medium, such as controller memory 50, and executable by one or processing circuitry, such as controller processor 48.

Accordingly, in such embodiments, the controller 46 may determine multiple detrough functions (process block 144). In some embodiments, detrough functions may be received from a manufacturer and stored in the controller memory 50. For example, the manufacturer may store the detrough functions during manufacturing. Additionally, the manufacturer may subsequently transmit the detrough functions to the radio frequency system 12. As such, the controller 46 may retrieve the multiple detrough functions from the controller memory 50.

Generally, each of the multiple detrough functions may describe a different relationship between the input analog electrical signal and the power amplifier supply voltage. For example, in some embodiments, each of the multiple detrough functions may include a different steepness coefficient. As such, when the input analog electrical signal is the same, the resulting power amplifier supply voltage profile described by each of the multiple detrough functions may be different.

In some embodiments, the multiple detrough functions may include a base detrough function and one or more augmented detrough functions. More specifically, the base detrough function may describe the default relationship power amplifier supply voltage and a modulated input analog electrical signal. On the other hand, augmented detrough functions may describe alternative relationships between power amplifier supply voltage and the modulated input analog electrical signal. For example, an augmented detrough function with a higher steepness coefficient may enable instantaneous power amplifier supply voltage to decrease at some input analog electrical signal voltages, thereby reducing margin with performance metric threshold and/or reducing power consumption. Additionally, an augmented detrough function with a lower steepness coefficient may enable instantaneous power amplifier supply voltage to increase at some input analog electrical signal voltages, thereby facilitating improvement of resulting performance metrics.

The controller 46 may then operate the radio frequency system 12 based at least in part on the first operational parameter set and one or more of the multiple detrough functions (process block 146) and determine the resulting performance metrics and output power (process block 148). As described above, the first operational parameter set may include a radio frequency gain index (RGI), which may indicate a peak voltage of the input analog electrical signal, and a peak power amplifier supply voltage (PA $V_{cc}$), which may indicate the power amplifier supply voltage corresponding with the peak voltage. Thus, the controller 46 may operate the radio frequency system 12 by instructing the transceiver 38 to generate the input analog electrical signal with a gain based at least in part on the radio frequency gain index. Additionally, the controller may instruct the adjustable power supply circuitry 45 to output the power amplifier supply voltage with a magnitude based at least in part on the input analog electrical signal voltage and one of the multiple detrough functions.

In some embodiments, the controller 46 may operate the radio frequency system 12 with the first operational parameter set and each of the multiple detrough functions. In this manner, differences resulting from use of each of the multiple detrough functions may be explicitly determined. In such embodiments, while operating with each of the multiple detrough functions, the controller 46 may determine resulting performance metrics, which may facilitate determining the second operational parameter set.

Additionally, since the instantaneous power amplifier supply voltage may change with each of the multiple detrough functions, the resulting output power when one of the augmented detrough functions is used may be different from the resulting output power determined in the coarse calibration. Accordingly, the controller 46 may also determine the resulting output power. As the number of output power and first operational set associations made by the coarse calibration and/or the number of detrough functions considered increase, the number of operations may increase exponentially, which may increase duration and/or power consumption of the calibration process.

Accordingly, in other embodiments, the controller 46 may operate the radio frequency system 12 with the first operational parameter set and the base detrough function. In such embodiments, while operating with the base detrough function, the controller 46 may determine resulting performance metrics and output power. Differences resulting from use of the one or more augmented detrough functions may be determined via precharacterized data that describes changes in performance metrics in relation to performance metrics determined for the base detrough function.

Figure 21:
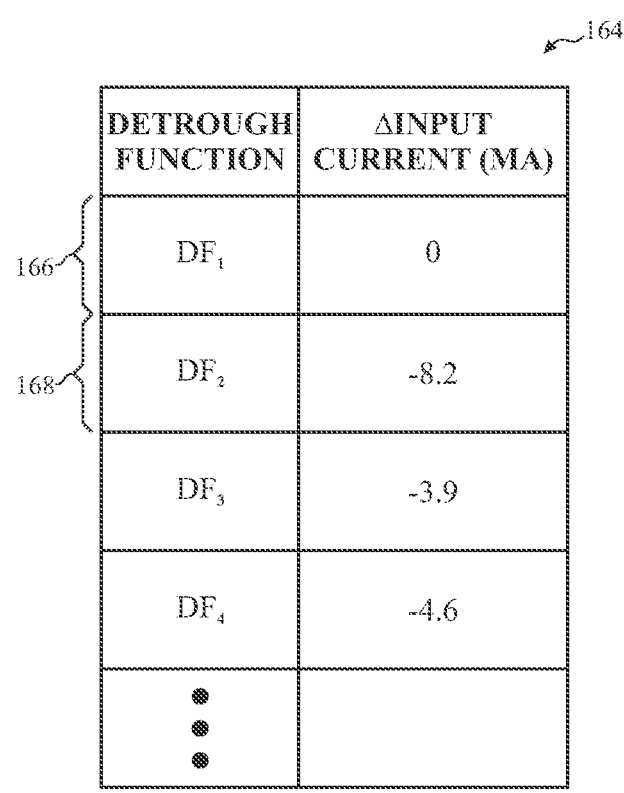
FIG. 21 is a table describing effect the different detrough functions have on input current, in accordance with an embodiment.

To help illustrate, examples of precharacterized data are described in FIGS. 19-21. In the depicted embodiments, the precharacterized data may be stored in the form of look-up-tables, which may be stored in a tangible non-transitory computer-readable medium (e.g., controller memory 50) and/or hardware (e.g., an ASIC). It should be appreciated that the precharacterized data is merely intended to be illustrative and not limiting. For example, in other embodiments, precharacterized data may also be determined for different compression values.

In some embodiments, the precharacterized data may also describe changes in adjacent channel leakage ratio. FIG. 19 depicts a table 152 that describes changes to adjacent channel leakage ratio (ACLR) when operating at a base detrough function and augmented detrough functions. In the depicted embodiment, each of the multiple detrough functions may be associated with changes in the adjacent channel leakage ratio in the first channel 74, the second channel 76, the fourth channel 80, and the fifth channel 82 in relation an adjacent channel leakage ratio determined for a base detrough function DF1. For example, in a first row 154, the table 152 indicates the changes in adjacent channel leakage ratio caused by the base detrough function DF1. As such, the table 152 indicates the change in adjacent leakage ratio is zero in each of the channels.

Additionally, in a second row 156, the table 152 indicates the changes in adjacent channel leakage ratio caused by a first augmented detrough function $DF_2$. More specifically, as depicted, the table 152 indicates that the adjacent channel leakage ratio changes by −4 dB in the first channel 74, −2 dB in the second channel 76, −1 dB in the fourth channel 80, and −2 dB in the fifth channel. In a similar manner, the table 152 may indicate the changes in adjacent channel leakage ratio caused by other augmented detrough functions (e.g., $DF_3$ and $DF_4$). As such, the controller 46 may determine the adjacent channel leakage ratio associated with an augmented detrough function based at least in part on the adjacent channel leakage ratio determined for the base detrough function and the precharacterized data (e.g., table 152).

In addition to adjacent channel leakage ratio, the precharacterized data may also describe changes in receive band noise. FIG. 20 depicts a table 158 that describes changes to resulting receive band noise (RxBN) when operating at a base detrough function and augmented detrough functions. In the depicted embodiment, each of the multiple detrough functions may be associated with changes in the receive band noise at a first receive frequency $F_{RX1}$, a second receive frequency $F_{RX2}$, a third receive frequency $F_{RX3}$, and a fourth receive frequency $F_{RX4}$ in relation to the receive band noise determined for the base detrough function $DF_1$. For example, in a first row 160, the table 158 indicates the changes in receive band noise caused by the base detrough function $DF_1$. As such, the table 152 indicates the change in receive band noise is zero at each of the receive frequencies.

Additionally, in a second row 162, the table 158 indicates the changes in receive band noise caused by a first augmented detrough function $DF_2$. More specifically, as depicted, the table 158 indicates that the receive band noise changes by −8.2 dB at the first receive frequency $F_{RX1}$, −4.7 dB at the second receive frequency $F_{RX2}$, −2.3 dB at the third receive frequency $F_{RX3}$, and −6.8 dB at the fourth receive frequency $F_{RX4}$. In a similar manner, the table 158 may indicate the changes in receive band noise caused by other augmented detrough functions (e.g., $DF_3$ and $DF_4$). As such, the controller 46 may determine the receive band noise associated with an augmented detrough function based at least in part on the receive band noise determined for the base detrough function and the precharacterized data (e.g., table 158).

The precharacterized data may also describe changes in input current to the power amplifier 40. The predominant input current to the power amplifier 40 is provided from the adjustable power supply circuitry 25. As such, the change in input current may facilitate determining changes in power consumption and/or gain of the power amplifier 40. FIG. 21 depicts a table 164 that describes changes to input current when operating at a base detrough function and augmented detrough functions. In the depicted embodiment, each of the multiple detrough functions may be associated with a change in the input current in relation to an input current determined for the base detrough function DF1. For example, in a first row 166, the table 164 indicates the change in input current caused by the base detrough function DF1. As such, the table 164 indicates the change in input current is zero.

Additionally, in a second row 168, the table 164 indicates the changes in input current caused by a first augmented detrough function $DF_2$. More specifically, as depicted, the table 164 indicates that the input current changes by −8.2 mA. In a similar manner, the table 164 may indicate the change in input current caused by other augmented detrough functions (e.g., $DF_3$ and $DF_4$). As such, the controller 46 may determine the input current associated with an augmented detrough function based at least in part on input current determined for the base detrough function and the precharacterized data (e.g., table 164).

In this manner, the precharacterized data may enable the controller to determine performance metrics associated with each augmented detrough function. If fact, the precharacterized data may enable determining the performance metrics even without operating the radio frequency system 12 with the first operational parameter set and each of the augmented detrough functions, which may enable reducing duration and/or power consumption of the calibration process.

Based at least in part on the resulting performance metrics, the controller 46 may then select one of the multiple detrough functions. As described above, one of the multiple detrough functions may be selected to reduce margin from performance metric thresholds, which may enable reducing power amplifier supply voltage and/or power consumption. Additionally, one of the multiple detrough functions may be selected to improve performance metrics so that performance metric thresholds are met.

The controller 46 may then associate the second operational parameter set with a desired output power (process block 150). More specifically, the second operational parameter set may include the selected detrough function, the radio frequency gain index (RGI) from the first operational parameter set, and the peak power amplifier supply voltage (PA $V_{cc}$) from the first operational parameter set.

Additionally, the desired output power may be set to the resulting output power when operating with the selected detrough function and/or the output power determined in the coarse calibration. Thus, in embodiments where the performance metrics are determined via precharacterized data, the controller 46 may instruct the radio frequency system to implement the second operational parameter set, measure the resulting output power, and set the desired output power accordingly. As described above, the controller 46 may then control subsequent (e.g., future) operation of the radio frequency system 12 based at least in part on the calibration data 52.

Accordingly, the technical effects of the present disclosure include enabling improved operation of a radio frequency system by controlling operation based at least in part on calibration data. More specifically, the calibration data may be determined so that an operational parameter set (e.g., second operational parameter set) is associated with a desired output power such that when implemented enables reducing in power consumption of the radio frequency system and/or improving quality of transmitted signals. In some embodiments, such calibration data may be determined by a calibration process that considers multiple detrough functions to include in the each operational parameter set. In fact, in some embodiments, the radio frequency system may implement different detrough functions when operating at different desired output powers.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A radio frequency system configured to facilitate wireless communication between electronic devices, wherein the radio frequency system comprises:
   a power amplifier configured to amplify a first analog electrical signal received from a transceiver to generate a first amplified analog electrical signal using a first power amplifier supply voltage, wherein the first amplified analog electrical signal is configured to be wirelessly transmitted from the radio frequency system at a desired output power;
   an adjustable power supply circuitry configured to output the first power amplifier supply voltage, wherein the adjustable power supply circuitry is configured to:
      output the first power amplifier supply voltage with a first magnitude based at least in part on a first detrough function when the desired output power is a first output power; and
      output the first power amplifier supply voltage with a second magnitude based at least in part on a second detrough function when the desired output power is a second output power, wherein the first magnitude and the second magnitude are different, the first detrough function and the second detrough function are different, and the first output power and the second output power are different; and
   a controller configured to:
      instruct the radio frequency system to wirelessly transmit a second amplified analog electrical signal, wherein the power amplifier is configured to generate the second amplified analog electrical signal by amplifying voltage of a second analog electrical signal using a second power amplifier supply voltage;
      associate a third output power of the second amplified analog electrical signal with a first operational parameter set, wherein the radio frequency system is configured to generate the second analog electrical signal and the second power amplifier supply voltage using the first operational parameter set;
      instruct the radio frequency system to wirelessly transmit a third amplified analog electrical signal using the first operational parameter set and the first detrough function;
      determine first performance metrics resulting from transmission of the third amplified analog electrical signal and that an output power of the third amplified analog electrical signal is the first output power;
      instruct, using the controller, the radio frequency system to wirelessly transmit a fourth amplified analog electrical signal using the first operational parameter set and a third detrough function;
      determine, using the controller, second performance metrics resulting from transmission of the fourth amplified analog electrical signal and a fourth output power of the fourth amplified analog electrical signal; and
      associate, using the controller, the first detrough function with the first output power when the first performance metrics have less margin with respect to performance metric thresholds than the second performance metrics.

2. The radio frequency system of claim 1, wherein:
the first detrough function is configured to describe a first relationship between the first power amplifier supply voltage and voltage of the first analog electrical signal; and
the second detrough function is configured to describe a second relationship between the first power amplifier supply voltage and the voltage of the first analog electrical signal, wherein the first relationship is different from the second relationship.

3. The radio frequency system of claim 1, comprising the transceiver, wherein the transceiver is configured to:
output the first analog electrical signal based at least in part on a first radio frequency gain index when the desired output power is the first output power, wherein the first analog electrical signal comprises a first peak voltage when the first radio frequency gain index is used; and
output the first analog electrical signal based at least in part on a second radio frequency gain index when the desired output power is the second output power, wherein the first analog electrical signal comprises a second peak voltage different from the first peak voltage when the second radio frequency gain index is used.

4. The radio frequency system of claim 1, comprising a digital pre-distortion circuitry configured to output a digital signal to the transceiver, wherein the digital pre-distortion circuitry is configured to:
apply a first pre-distortion coefficient to the digital signal when the desired output power is the first output power; and
apply a second pre-distortion coefficient to the digital signal when the desired output power is the second output power, wherein the first pre-distortion coefficient and the second pre-distortion coefficient distort the digital signal in different manners.

5. The radio frequency system of claim 1, wherein the radio frequency system is configured to store calibration data that:
associates the first output power with the first operational parameter set and the first detrough function; and
associates the second output power with a second operational parameter set and the second detrough function.

6. The radio frequency system of claim 5, wherein the controller is configured to:
determine the calibration data by executing a calibration process; and
control operation of the radio frequency system using the calibration data by instructing the radio frequency system to:
implement the first operational parameter set and the first detrough function when the desired output power is the first output power; and
implement the second operational parameter set and the second detrough function when the desired output power is the second output power.

7. A tangible, non-transitory, computer-readable medium configured to store instructions executable by a processor of a radio frequency system, wherein the instructions comprise instructions to:
execute, using the processor, a coarse calibration to associate a first output power with a first operational parameter set, wherein:
the first operational parameter set comprises a radio frequency gain index and a peak power amplifier supply voltage; and
the instructions to execute the coarse calibration comprise instructions to:
instruct, using the processor, a transceiver to increase input analog electrical signal voltage supplied to a power amplifier from a minimum input voltage to a maximum input voltage in a stepwise manner;
instruct, using the processor, an adjustable power supply circuitry to decrease power amplifier supply voltage supplied to the power amplifier from a maximum power amplifier supply voltage to a minimum power amplifier supply voltage in a stepwise manner while the input analog electrical signal voltage is at each voltage step;
determine, using the processor, output power and first performance metrics resulting from the radio frequency system operating at each input analog electrical signal voltage and power amplifier supply voltage pair; and
determine, using the processor, the first operational parameter set by comparing the first performance metrics to performance metric thresholds;
instruct, using the processor, the radio frequency system to transmit a first signal using the first operational parameter set and a base detrough function;
determine, using the processor, second performance metrics resulting from transmission of the first signal;
determine, using the processor, changes in the second performance metrics resulting from operating the radio frequency using the first operational parameter set with each of a plurality of augmented detrough functions; and
associate, using the processor, a second operational parameter set with a second output power to enable the radio frequency system to subsequently transmit a second signal using the second operational parameter set when desired output power of the second signal is equal to the second output power, wherein the second operational parameter set comprises the radio frequency gain index, the peak power amplifier supply voltage, and one of the plurality of augmented detrough functions, wherein the one of the plurality of augmented detrough functions is selected based at least in part on the changes that reduce margin between the second performance metrics and the performance metric thresholds.

8. The computer-readable medium of claim 7, comprising instructions to determine the changes in the second performance metrics, wherein the instructions to determine the changes in the second performance metrics comprise instructions to:
instruct, using the processor, the radio frequency system to transmit a third signal based at least in part on the first operational parameter set and a first augmented detrough function;
determine, using the processor, third performance metrics resulting from transmission of the second signal; and
determine, using the processor, difference between the second performance metrics and the third performance metrics.

9. The computer-readable medium of claim 7, wherein the base detrough function and the plurality of augmented detrough functions are each configured to describe a different relationship between the power amplifier supply voltage supplied to the power amplifier and voltage of an input analog electrical signal amplified by the power amplifier.

10. The computer-readable medium of claim 7, wherein the base detrough function and the plurality of augmented detrough functions each comprises a different steepness coefficient.

11. A method comprising:
   instructing, using a controller, a radio frequency system to wirelessly transmit a first amplified analog electrical signal using an operational parameter set and a first detrough function, wherein the radio frequency system comprises:
      a digital pre-distortion circuit that adjusts digital electrical signals based at least in part on pre-distortion coefficients to offset noise expected to be introduced by the radio frequency system, wherein the digital pre-distortion circuit outputs a first digital electrical signal based at least in part on a pre-distortion coefficient included in the operational parameter set;
      a transceiver communicatively coupled to the digital pre-distortion circuit that outputs analog electrical signals based at least in part on radio frequency gain indices and the digital electrical signals, wherein the transceiver outputs a first analog electrical signal based at least in part on the first digital electrical signal and a radio frequency gain index included in the operational parameter set;
      a power amplifier communicatively coupled to the transceiver that generates amplified analog electrical signals by amplifying the analog electrical signals received from the transceiver, wherein the power amplifier generates the first amplified analog electrical signal by amplifying the first analog electrical signal using a first power amplifier supply voltage; and
      a power supply circuit electrically coupled to the power amplifier that supplies power amplifier supply voltages to the power amplifier based at least in part on detrough functions, wherein the power supply circuit supplies the first power amplifier supply voltage to the power amplifier based at least in part on the first detrough function and voltage of the first analog electrical signal, wherein the first detrough function comprises a first steepness coefficient;
   determining, using the controller, first performance metrics resulting from transmission of the first amplified analog electrical signal from the radio frequency system;
   instructing, using the controller, the radio frequency system to wirelessly transmit a second amplified analog electrical signal using the operational parameter set and a second detrough function, wherein:
      the digital pre-distortion circuit outputs a second digital electrical signal based at least in part on the pre-distortion coefficient;
      the transceiver outputs a second analog electrical signal based at least in part on the second digital electrical signal and the radio frequency gain index;
      the power amplifier generates the second amplified analog electrical signal by amplifying the second analog electrical signal using a second power amplifier supply voltage; and
      the power supply circuit supplies the second power amplifier supply voltage to the power amplifier based at least in in part on the second detrough function and voltage of the second analog electrical signal,
      wherein the second detrough function comprises a second steepness coefficient greater than the first steepness coefficient;
   determining, using the controller, second performance metrics resulting from transmission of the second amplified analog electrical signal from the radio frequency system;
   associating, using the controller, the second detrough function with the operational parameter set when both the first performance metrics and the second performance metrics meet performance metric thresholds to facilitate reducing power consumption resulting from subsequent transmission of a third amplified analog electrical signal from the radio frequency system using the operational parameter set; and
   associating, using the controller, the first detrough function with the operational parameter set when the first performance metrics meet the performance metric thresholds and the second performance metrics do not meet the performance metric thresholds to facilitate meeting the performance metric thresholds when subsequently transmitting the third amplified analog electrical signal from the radio frequency system using the operational parameter set.

12. The method of claim 11, comprising associating, using the controller, the second detrough function with the operational parameter set when the second performance metrics have less margin with respect to the performance metric thresholds than the first performance metrics.

13. The method of claim 11, wherein:
   instructing the radio frequency system to wirelessly transmit the first amplified analog electrical signal comprises instructing the power supply circuit to supply the first power amplifier supply voltage with a first magnitude to the power amplifier;
   instructing the radio frequency system to wirelessly transmit the second amplified analog electrical signal comprises instructing the power supply circuit to supply the second power amplifier supply voltage with a second magnitude to the power amplifier; wherein:
      the first magnitude of the first power amplifier supply voltage and the second magnitude of the second power amplifier supply voltage are approximately equal when the first magnitude and the second magnitude are both greater than a threshold magnitude; and
      the first magnitude of the first power amplifier supply voltage and the second magnitude of the second power amplifier supply voltage are different when the first magnitude is not greater than the threshold magnitude, the second magnitude is not greater than the threshold magnitude, or both; and
   the operational parameter set comprises:
      the pre-distortion coefficient, wherein the pre-distortion coefficient comprises an amplitude modulation pre-distortion coefficient or a phase modulation (AMPM) pre-distortion coefficient;
      the radio frequency gain index, wherein the radio frequency gain index indicates a peak voltage of an analog electrical signal supplied from the transceiver to the power amplifier; and
      a peak amplifier supply voltage that indicates a power amplifier supply voltage corresponding with the peak voltage to be supplied from the power supply circuit to the power amplifier.

14. The method of claim 11, wherein:
the first performance metrics comprise a first adjacent channel leakage ratio, a first receive band noise, a first compression value, or any combination thereof;
the second performance metrics comprise a second adjacent channel leakage ratio, a second receive band noise, a second compression value, or any combination thereof; and
the performance metric thresholds comprise an adjacent channel leakage ratio threshold, a receive band noise threshold, or both.

15. An electronic device comprising:
a controller operatively coupled to a radio frequency system that facilitates wireless transmission of data, wherein the controller is configured to:
instruct a transceiver in the radio frequency system to generate an analog representation of the data as a modulated analog electrical signal output to a power amplifier;
instruct an adjustable power supply circuitry in the radio frequency system to supply a first power amplifier supply voltage with a first voltage profile to the power amplifier to enable the power amplifier to generate a first amplified analog electrical signal that is to be wirelessly transmitted from the radio frequency system, wherein:
the adjustable power supply circuitry generates the first power amplifier supply voltage with the first voltage profile as a first function of voltage of the modulated analog electrical signal; and
the first voltage profile comprises:
a first portion corresponding to when the voltage of the modulated analog electrical signal is greater than a threshold voltage; and
a second portion corresponding to when the voltage of the modulated analog electrical signal is less than the threshold voltage;
instruct the adjustable power supply circuitry to supply a second power amplifier supply voltage with a second voltage profile to the power amplifier to enable the power amplifier to generate a second amplified analog electrical signal that is to be wirelessly transmitted from the radio frequency system, wherein:
the adjustable power supply circuitry generates the second power amplifier supply voltage with the second voltage profile as a second function of the voltage of the modulated analog electrical signal different from the first function; and
the second voltage profile comprises:
a third portion corresponding to when the voltage of the modulated analog electrical signal is greater than the threshold voltage, wherein the third portion of the second voltage profile and the first portion of the first voltage profile are approximately equal; and
a fourth portion corresponding to when the voltage of the modulated analog electrical signal is less than the threshold voltage,
wherein the fourth portion of the second voltage profile and the second portion of the first voltage profile are different; and
generate calibration data used by the radio frequency system to subsequently wirelessly transmit a third amplified analog electrical signal by associating the first function to a first output power of the first amplified analog electrical signal, associating the second function to a second output power of the second amplified analog electrical signal, or both.

16. The electronic device of claim 15, wherein the controller is configured to:
associate the second function to the second output power when first performance metrics resulting from transmission of the first amplified analog electrical signal and second performance metrics resulting from transmission of the second amplified analog electrical signal both meet performance metric thresholds, wherein the fourth portion of the second voltage profile is less than the second portion of the first voltage profile to facilitate reducing power consumption of the radio frequency system used to wirelessly transmit the third amplified analog electrical signal; and
associate the first function to the first output power when the first performance metrics meet the performance metric thresholds and the second performance metrics do not meet the performance metric thresholds to facilitate meeting the performance thresholds when the radio frequency system wirelessly transmits the third amplified analog electrical signal.

17. The electronic device of claim 15, wherein the modulated analog electrical signal is modulated between zero volts and a peak voltage.

18. The electronic device of claim 15, wherein:
the first function comprises a first steepness coefficient; and
the second function comprises a second steepness coefficient different from the first steepness coefficient.

19. The electronic device of claim 15, wherein the electronic device comprises a portable phone, a media player, a personal data organizer, a handheld game platform, a tablet device, a computer, or any combination thereof.

20. The computer-readable medium of claim 7, wherein the instructions comprise instructions to:
determine, using the processor, the desired output power of the second signal to be transmitted from the radio frequency system;
retrieve, using the processor, calibration data that associates the second output power with the second operational parameter set and a third output power with a third operational parameter set, wherein the second operational parameter set comprises a first augmented detrough function and the third operational parameter set comprises a second augmented detrough function;
instruct, using the processor, the adjustable power supply circuitry to output a first power amplifier supply voltage to the power amplifier that generates the second signal based on the second operational parameter set when the desired output power is equal to the second output power, wherein the first augmented detrough function describes the first power amplifier supply voltage as a first function of an input analog electrical signal supplied from the transceiver to the power amplifier; and
instruct, using the processor, the adjustable power supply circuitry to output a second power amplifier supply voltage to the power amplifier based on the third operational parameter set when the desired output power is equal to the third output power, wherein the second augmented detrough function describes the second power amplifier supply voltage as a second function of the input analog electrical signal.

21. A tangible, non-transitory, computer-readable medium configured to store instructions executable by a processor of a radio frequency system, wherein the instructions comprise instructions to:
  execute, using the processor, a coarse calibration to associate a first output power with a first operational parameter set, wherein the first operational parameter set comprises a radio frequency gain index and a peak power amplifier supply voltage;
  instruct, using the processor, the radio frequency system to transmit a first signal using the first operational parameter set and a base detrough function;
  determine, using the processor, first performance metrics resulting from transmission of the first signal;
  determine, using the processor, changes in the first performance metrics resulting from operating the radio frequency system using the first operational parameter set with each of a plurality of augmented detrough functions;
  associate, using the processor, a second operational parameter set with a second output power to enable the radio frequency system to subsequently transmit a second signal using the second operational parameter set when a desired output power of the second signal is equal to the second output power, wherein the second operational parameter set comprises the radio frequency gain index, the peak power amplifier supply voltage, and a first one of the plurality of augmented detrough functions, wherein the first one of the plurality of augmented detrough functions is selected based at least in part on the changes that reduce margin between the first performance metrics and performance metric thresholds;
  execute, using the processor, the coarse calibration to associate a third output power with a third operational parameter set;
  instruct, using the processor, the radio frequency system to transmit a third signal based at least in part on the third operational parameter set and the base detrough function;
  determine, using the processor, second performance metrics resulting from transmission of the third signal;
  determine, using the processor, changes in the second performance metrics resulting from operating the radio frequency system using the third operational parameter set with each of the plurality of augmented detrough functions; and
  associate, using the processor, a fourth operational parameter set with a fourth output power to enable the radio frequency system to subsequently transmit a fourth signal using the fourth operational parameter set when a desired output power of the fourth signal is equal to the fourth output power, wherein the fourth operational parameter set comprises the third operational parameter set and one of the base detrough function and the plurality of augmented detrough functions.

22. The computer-readable medium of claim 21, comprising instructions to:
  determine, using the processor, the desired output power of the second signal;
  retrieve, using the processor, calibration data that associates the second output power with the second operational parameter set and associates the fourth output power with the fourth operational parameter set;
  instruct, using the processor, an adjustable power supply circuitry to output a first power amplifier supply voltage to a power amplifier that generates the second signal based at least in part on the second operational parameter set when the desired output power of the second signal is equal to the second output power, wherein the first one of the plurality of augmented detrough functions describes the first power amplifier supply voltage as a first function of an analog electrical signal input to the power amplifier from a transceiver; and
  instruct, using the processor, the adjustable power supply circuitry to output a second power amplifier supply voltage to the power amplifier based on the fourth operational parameter set when the desired output power of the second signal is equal to the fourth output power, wherein a detrough function in the fourth operational parameter set describes the second power amplifier supply voltage as a second function of the analog electrical signal input to the power amplifier from the transceiver.

23. The computer-readable medium of claim 22, comprising instructions to instruct, using the processor, the adjustable power supply circuitry to output the first power amplifier supply voltage to the power amplifier based at least in part on the second operational parameter set when the desired output power of the second signal is closer to the second output power than the fourth output power.

24. The computer-readable medium of claim 22, comprising instructions to:
  instruct, using the processor, the transceiver to output the analog electrical signal using a first radio frequency gain index when the desired output power is the second output power; and
  instruct, using the processor, the transceiver to output the analog electrical signal using a second radio frequency gain index when the desired output power is the fourth output power, wherein voltage of the analog electrical signal is different when the first radio frequency gain index is used and when the second radio frequency gain index is used.

25. The computer-readable medium of claim 22, comprising instruction to:
  instruct, using the processor, a digital pre-distortion circuitry to apply a first pre-distortion coefficient to a digital signal supplied to the transceiver when the desired output power is the second output power; and
  instruct, using the processor, the digital pre-distortion circuitry to apply a second pre-distortion coefficient to the digital signal when the desired output power is the fourth output power, wherein the first pre-distortion coefficient and the second pre-distortion coefficient distort the digital signal in different manners.

* * * * *